(12) United States Patent
Shimanuki

(10) Patent No.: US 8,637,965 B2
(45) Date of Patent: Jan. 28, 2014

(54) SEMICONDUCTOR DEVICE AND A METHOD OF MANUFACTURING THE SAME AND A MOUNTING STRUCTURE OF A SEMICONDUCTOR DEVICE

(75) Inventor: Yoshihiko Shimanuki, Nanyou (JP)

(73) Assignees: Renesas Electronics Corporation, Kanagawa (JP); Hitachi Yonezawa Electronics Co., Ltd, Yonezawa (JP)

( * ) Notice: Subject to any disclaimer, the term of this patent is extended or adjusted under 35 U.S.C. 154(b) by 0 days.

(21) Appl. No.: 13/357,076

(22) Filed: Jan. 24, 2012

(65) Prior Publication Data

US 2012/0146228 A1 Jun. 14, 2012

Related U.S. Application Data

(60) Continuation of application No. 12/897,221, filed on Oct. 4, 2010, now Pat. No. 8,115,298, which is a continuation of application No. 12/610,900, filed on Nov. 2, 2009, now Pat. No. 7,821,119, which is a continuation of application No. 12/222,099, filed on Aug. 1, 2008, now Pat. No. 7,777,312, which is a division of application No. 10/879,010, filed on Jun. 30, 2004, now Pat. No. 7,804,159, which is a continuation of application No. 10/227,817, filed on Aug. 27, 2002, now abandoned, which is a continuation of application No. 09/623,344, filed as application No. PCT/JP00/04340 on Jun. 30, 2000, now abandoned.

(30) Foreign Application Priority Data

Jun. 30, 1999 (JP) .................................. 11-184739
Apr. 6, 2000 (JP) ................................. 2000-105251

(51) Int. Cl.
*H01L 23/495* (2006.01)

(52) U.S. Cl.
USPC ................... 257/676; 257/692; 257/E23.046

(58) Field of Classification Search
USPC ................................. 257/676, 692, E23.046
See application file for complete search history.

(56) References Cited

U.S. PATENT DOCUMENTS

| | | | |
|---|---|---|---|
| 5,264,730 A * | 11/1993 | Matsuzaki et al. | 257/787 |
| 5,287,000 A | 2/1994 | Takahashi et al. | |
| 5,327,008 A * | 7/1994 | Djennas et al. | 257/666 |
| 5,378,656 A * | 1/1995 | Kajihara et al. | 29/827 |

(Continued)

FOREIGN PATENT DOCUMENTS

| | | |
|---|---|---|
| JP | 61-139052 A | 6/1986 |
| JP | 03-232264 | 10/1991 |

(Continued)

*Primary Examiner* — Steven J Fulk
(74) *Attorney, Agent, or Firm* — Mattingly & Malur, PC

(57) ABSTRACT

The semiconductor device includes a tab including a chip supporting surface, and a back surface opposite to the chip supporting surface; a plurality of suspension leads supporting the tab; a plurality of leads arranged between the suspension leads; a semiconductor chip mounted on the chip supporting surface of the tab, the semiconductor chip including a main surface, a plurality of pads formed on the main surface, and a rear surface opposite to the main surface; a seal portion sealing the semiconductor chip such that a part of each of the leads is exposed from the seal portion; and a Pb-free solder formed on the part of each of the leads. A part of the rear surface of the semiconductor chip is contacted with the seal portion.

10 Claims, 38 Drawing Sheets

(56) References Cited

U.S. PATENT DOCUMENTS

| | | | |
|---|---|---|---|
| 5,409,866 A | 4/1995 | Sato et al. | |
| 5,438,478 A * | 8/1995 | Kondo et al. | 361/704 |
| 5,521,429 A | 5/1996 | Aono et al. | |
| 5,583,372 A | 12/1996 | King et al. | |
| 5,594,274 A | 1/1997 | Suetaki | |
| 5,614,441 A | 3/1997 | Hosokawa et al. | |
| 5,637,915 A | 6/1997 | Sato et al. | |
| 5,834,831 A | 11/1998 | Kubota et al. | |
| 5,874,773 A * | 2/1999 | Terada et al. | 257/676 |
| 5,885,852 A | 3/1999 | Kishikawa et al. | |
| 5,888,883 A | 3/1999 | Sasaki et al. | |
| 5,942,794 A * | 8/1999 | Okumura et al. | 257/666 |
| 6,025,640 A | 2/2000 | Yagi et al. | |
| 6,081,029 A | 6/2000 | Yamaguchi | |
| 6,111,306 A | 8/2000 | Kawahara et al. | |
| 6,133,637 A | 10/2000 | Hikita et al. | |
| 6,201,292 B1 | 3/2001 | Yagi et al. | |
| 6,208,020 B1 | 3/2001 | Minamio et al. | |
| 6,229,200 B1 | 5/2001 | McCellan et al. | |
| 6,281,568 B1 | 8/2001 | Glenn et al. | |
| 6,291,273 B1 | 9/2001 | Miyaki et al. | |
| 6,352,880 B1 | 3/2002 | Takai et al. | |
| 6,355,502 B1 | 3/2002 | Kang et al. | |
| 6,900,524 B1 | 5/2005 | Minamio et al. | |
| 6,960,396 B2 | 11/2005 | Shimokawa et al. | |
| 7,013,564 B2 | 3/2006 | Shimokawa et al. | |
| 7,709,746 B2 | 5/2010 | Shimokawa et al. | |
| 8,503,189 B2 | 8/2013 | Shimokawa et al. | |
| 2001/0052643 A1 * | 12/2001 | Sugihara et al. | 257/692 |
| 2002/0041010 A1 | 4/2002 | Shibata | |
| 2003/0001249 A1 | 1/2003 | Shimanuki | |
| 2003/0127711 A1 | 7/2003 | Kawai et al. | |
| 2005/0106783 A1 | 5/2005 | Miyata | |
| 2005/0199987 A1 | 9/2005 | Danno et al. | |

FOREIGN PATENT DOCUMENTS

| | | | |
|---|---|---|---|
| JP | 5-129473 | 5/1993 | |
| JP | 07-030036 | 1/1995 | |
| JP | 07-211852 | 8/1995 | |
| JP | 9-8205 | 1/1997 | |
| JP | 10-189830 | 7/1998 | |
| JP | 10189830 A * | 7/1998 | H01L 23/28 |
| JP | 10-335566 | 12/1998 | |
| JP | 11-040720 | 2/1999 | |
| JP | 11-07440 | 3/1999 | |
| JP | 11-074440 | 3/1999 | |
| JP | 11-111749 | 4/1999 | |
| JP | 11-260983 A | 9/1999 | |
| JP | 2000-12758 | 1/2000 | |
| WO | 98-29903 | 7/1998 | |
| WO | 01/03186 | 1/2001 | |

* cited by examiner

SEMICONDUCTOR DEVICE AND A METHOD OF MANUFACTURING THE SAME AND A MOUNTING STRUCTURE OF A SEMICONDUCTOR DEVICE

CROSS-REFERENCES

This is a continuation application of U.S. Ser. No. 12/897,221, filed Oct. 4, 2010, which is a continuation application of U.S. Ser. No. 12/610,900, filed Nov. 2, 2009 (now U.S. Pat. No. 7,821,119), which is a continuation application of U.S. Ser. No. 12/222,099, filed Aug. 1, 2008 (now U.S. Pat. No. 7,777,312), which is a divisional application of U.S. patent application Ser. No. 10/879,010, filed Jun. 30, 2004 (now U.S. Pat. No. 7,804,159), which is a continuation application of U.S. patent application Ser. No. 10/227,817, filed Aug. 27, 2002 (now abandoned); which is a continuation application of U.S. patent application Ser. No. 09/623,344, filed Aug. 31, 2000 (now abandoned); which is a 371 of PCT/JP00/04340, filed Jun. 30, 2000. The entire disclosures of all of the above-identified applications are hereby incorporated by reference.

This application claims priority to JP 11-184739, filed Jun. 30, 1999 and JP-2000-105251, filed Apr. 6, 2000.

TECHNICAL FIELD

The present invention relates generally to semiconductor fabrication technologies and, more particularly, to techniques adapted for miniaturization and thickness reduction plus cost down as well as reliability improvements.

BACKGROUND ART

Those techniques as will be explained in brief below have been taken into consideration by the inventors as named herein during studying for reduction to practice of the present invention as disclosed and claimed herein.

The quest for further miniaturization or "downsizing" of modern electronic equipment results in shrinkage of dimension and weight reduction and tends to grow rapidly in the markets of electronics and semiconductor industries. Under such circumstances, it is becoming more important in the manufacture of small size electronic equipment to further improve the large-scale integrated circuit (LSI) chip mount architectures—that is, to develop an improved LSI chip packaging technique with ultra-high integration densities.

In addition, as the markets of electronics grow, improvements in productivity have been more strictly required while simultaneously reducing manufacturing costs.

A first prior known approach to satisfying the above technological requirements is to employ a resin sealed or hermetic surface-mount semiconductor device structure as disclosed in, for example, Published Unexamined Japanese Patent Application ("PUJPA") No. 5-129473. The prior art device as taught thereby is such that as shown in FIG. 29, this device employs a lead frame 35 with a pattern of electrical leads 33 and a chip support paddle or die pad 34, also known as a "tab" among those skilled in the art, being located on the same surface, wherein the prior art is featured in that the leads 33 are electrically connected at lower surfaces to a semiconductor chip 36 via bonding wires 37, wherein the lower surfaces are for use as external electrodes each functioning as an electrical connector portion with external circuitry operatively associated with the semiconductor device.

Unfortunately the first prior art shown in FIG. 29 is associated with a problem which follows. As this is structurally designed so that the tab 34's parts-mount surface side is exposed from the lower surface of the semiconductor device, the tab 34 will possibly come into direct contact with leads on the parts mount substrate when mounting the semiconductor device on the mount substrate, which in turn makes it impossible to form any leads at corresponding portions of the mount substrate, resulting in a noticeable decrease in the degree of freedom of substrate design schemes. Another problem is that since the device is structurally arranged so that the tab 34 is sealed only at its one surface, the resulting contact area between the tab 34 and a sealing material 38 used decreases causing the tight contact or adhesiveness to degrade accordingly, which would result in a decrease in reliability of the semiconductor device.

A second prior art resin sealed semiconductor device is found in PUJPA No. 10-189830 (JP-A-10189830). This device is shown in FIG. 30, which includes a semiconductor element 42 as mounted on a tab 41 that in turn is supported by a hanging or "suspending" lead 40 of a lead frame 39, metal fine leads 45 for electrical interconnection between electrodes 43 on the upper surface of said semiconductor element 42 and associative inner leads 44, a sealing resin material 46 for use in sealing an outer surrounding region of the semiconductor element 42 containing metal fine lead regions over the upper surface of semiconductor element 42, and external connect terminals 47 that are laid out in a bottom surface region of said sealing resin 46 for connection with said inner leads 44, wherein said suspension lead 40 has been subjected to the so-called "up-set" processing thus having step-like differences 48, called "stepped portions," and wherein the sealing resin 46 is also formed at part underlying said tab 41 to a thickness corresponding to the amount of said upset processing.

The second prior art shown herein is such that since the suspension lead 40 of the lead frame 39 has been subject to the up-set processing to have the stepped portions 48, it becomes possible to permit the sealing resin 46 to be present at the part underlying the tab 41, which in turn makes it possible to provide substantially the double-face sealed semiconductor device structure with respect to the lead frame 39, thereby offering increased reliability when compared to said first prior art discussed above.

Another advantage of the prior art is that in view of the fact that this is structurally designed to prevent exposure of the tab 41's parts-mount substrate side from the lower surface of the semiconductor device, the tab 41 will no longer come into contact with those leads on the mount substrate, thereby increasing the degree of freedom in parts mount design schemes.

Other examples of the semiconductor device with its tab subjected to the up-set processing (tab finishing treatment) are known among those skilled in the art, one of which is disclosed in JP-A-11-74440.

Regrettably said first prior art is faced with a problem in that a decrease in seal material-to-tab contact area can be lower the resultant adhesiveness thus reducing the reliability of the semiconductor device because of the fact that this device is structured so that the tab is sealed solely at its one surface in order to improve the thickness reducibility.

Additionally, although said second prior art and the one as taught by the above-identified Japanese document JP-A-11-74440 are drawn to the double-face resin-sealed semiconductor device with respect to the lead frame used therein, which offers an advantage as to an increase in reliability when compared to said first prior art, stepped portions included are to be formed through the up-set processing whereby each of them suffers from a problem in that it is impossible to improve the thickness reducibility to the extent that is equivalent to the first art and also a "tab dislocation" problem including displacement or strain of the tab occurring during execution of such up-set Processing.

In short, it has been affirmed by the inventors that even the first and second prior art devices stated supra have met with limited success as to the capability of solving the conflicting or "trade-off" problems—i.e. the thickness reducibility and increased reliability required.

It is therefore a primary objective of the present invention to provide a new and improved semiconductor device capable of achieving both the thickness reducibility and high reliability at a time and also methodology of manufacturing the semiconductor device along with a parts mount structure of the same.

Another object of this invention is to provide an improved semiconductor device capable of increasing productivities while reducing production costs and a method of manufacturing the device as well as a parts mount structure of same.

A further object of the invention is to provide a semiconductor device capable of—preventing any accidental electrical short circuiting and unwanted lead dropdown detachment otherwise occurring during parts mounting processes and a method of manufacturing the device as well as a parts mount structure of same.

These and other objects, features and advantages of the invention will be apparent from the following more particular description of preferred embodiments of the invention, as illustrated in the accompanying drawings.

DISCLOSURE OF THE INVENTION

Some representative ones of the inventive teachings as disclosed and claimed herein will be explained in brief below.

A semiconductor device comprising a tab supported by a plurality of suspension leads, a plurality of leads disposed to surround periphery of said tab, a semiconductor chip mounted on one principal surface of said tab and electrically connected to one principal surface of said plurality of leads, and a sealing resin for sealing said plurality of leads and said semiconductor chip plus said tab, wherein the remaining principal surface opposite to said one principal surface of said plurality of leads is exposed from said sealing resin- and that said tab is less in thickness than said plurality of leads.

In addition, a method of manufacturing a semiconductor device comprises the steps of: preparing a matrix lead frame including a plurality of lead frames each having a plurality of leads and a tab less in thickness than said plurality of leads plus a suspension lead for support of said tab; performing die bonding for mounting a semiconductor chip on or over the tab of each said lead frame; performing wire bonding for connection by wires between said semiconductor chip and the plurality of leads of said lead frame; sealing with a sealing resin said lead frame and said semiconductor chip plus said wires to permit said plurality of leads to be exposed on a lower surface side thereof; and cutting said matrix lead frame into a plurality of unitary lead portions at part in close proximity to a seal region as sealed at said step of sealing with the sealing resin to thereby obtain a plurality of semiconductor devices.

Furthermore, a mounting structure of a semiconductor device in accordance with the invention is a semiconductor device that is arranged to include a pattern of electrical leads on a mount substrate, a tab supported by a plurality of suspension leads, a plurality of leads as laid out to surround the periphery of said tab, a semiconductor chip that is mounted on or over one principal surface of said tab and is electrically connected to one principal surface of said plurality of leads, and a sealing resin Material for use in sealing said plurality of leads and said semiconductor chip plus said tab, wherein the remaining principal surface on an opposite side to said one principal surface of said plurality of leads is exposed from said sealing resin, and wherein an adhesive material is used to attain coupling with the other principal surface of those leads of the semiconductor device with said tab formed to be less in thickness than said plurality of leads.

Moreover, a resin sealed semiconductor device comprises a tab for support of a semiconductor chip, a seal section as formed by resin sealing of said semiconductor chip, a plurality of tab suspension leads including a supporting portion for use in supporting said tab and an exposed portion as coupled thereto and exposed to a surface on a semiconductor device mount side surface of said seal section, said supporting portion being formed to be thinner than said exposed portion, a plurality of leads disposed around said tab and exposed to said semiconductor device mount side surface of said seal section, and a connection member for connection between a surface electrode of said semiconductor chip and a corresponding one of said leads, wherein said tab suspension leads are coupled together via said tab.

In accordance with the instant invention, as the support portion of the tab at the tab suspension leads is formed to have a decreased thickness, it is possible to bury or embed the support portion in the seal section with the sealing resin covering the same thereby enabling provision of the intended structure with the tab suspension lead's exposed portion being exposed only at the end(s) at a corner or corners on the back surface of the seal section.

This in turn makes it possible to form an increased clearance between the exposed portion of the tab suspension lead and its neighboring lead on the back surface of the seal section while at the same time enabling prevention of electrical shorting otherwise occurring when mounting the semiconductor device on a parts mount substrate or board or else due to the fact that the tab is buried within the seal section.

Further, a resin sealed semiconductor device is provided which comprises a tab supporting a semiconductor chip and being smaller than said semiconductor chip, a seal section as formed by resin sealing of said semiconductor chip, a supporting portion for support of said tab, a plurality of leads disposed around said tab and exposed to a semiconductor device mount side surface of said seal section, and a connection member for connection between more than one surface electrode of said semiconductor chip and a corresponding one of said leads, wherein said tab and said semiconductor chip are in contact by adhesion with each other at an inside location relative to said surface electrode of said semiconductor chip.

According to the invention, it is possible to support the specified part at or near the end portion on the back surface of the semiconductor device by a bonding stage including a heatup wire-bonding process. This makes it possible during wire bonding to apply suitable ultrasonic waves and/or heat to wires being bonded, thereby enabling improvement in reliability and adhesiveness of such wire bonding.

In addition, a method of manufacturing a resin sealed semiconductor device comprises the steps 'of: preparing a lead frame including a tab capable of supporting a semiconductor chip, a plurality of tab suspension leads having a support section for use in supporting said tab and an exposed portion coupled thereto with said support section being thinner than said exposed portion, and a plurality of leads as disposed around said tab; adherently securing said tab and said semiconductor chip together; using a connection member to connect a surface electrode of said semiconductor chip to a corresponding one of said leads; forming a seal section by causing a sealing resin to flow onto an opposite surface to a chip support surface of said tab while covering a thickness reduced portion of said tab suspension lead with said sealing resin and then by disposing said plurality of leads and said exposed portion of said tab suspension lead on a semiconductor device mount side surface to thereby resin-mold said semiconductor chip; and subdividing said tab suspension lead into portions at said exposed portion of said tab suspension lead while separating said plurality of leads from a frame body of said lead frame.

BRIEF DESCRIPTION OF THE DRAWINGS

A diagram showing

A diagram showing

A flow diagram showing

DESCRIPTION OF THE PREFERRED EMBODIMENTS

Figure 1:
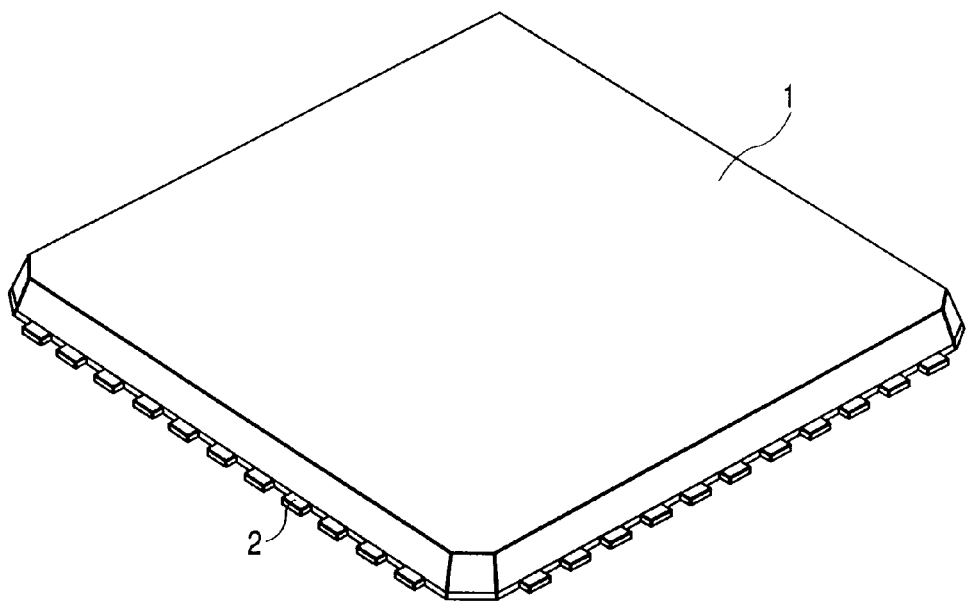
FIG. 1 shows a diagram of a perspective view of an exterior appearance of a semiconductor device in accordance with an embodiment 1 of the present invention.

In a detailed description of several embodiment of the invention set forth below, any explanation as to the same or like components will not be repeated in principle, except as otherwise believed necessary.

Also note that although in the description of embodiments below an explanation will be given with subdivision into a plurality of sections or preferred forms for reduction to practice of the invention, these are not the ones having no relation to one another and are in certain relation that one is a modified example or detailed one or additional explanation of part or the whole of another, except as otherwise indicated specifically.

Further note that in the description of embodiments below, those number of constituent parts or components as used therein (including piece numbers, values, quantities, ranges, etc.) are mere examples and the invention should not be limited only to such specific quantity and any appropriate numbers that are greater or less than the specific numbers may also be employable on a case-by-case basis, except as otherwise indicated specifically and also except for certain cases where the invention is apparently limited to specific numbers in a viewpoint of principles thereof.

Some preferred embodiments of the present invention will now be explained in detail with reference to the accompanying drawings. Note here that in all of the attached drawings for use in explaining such embodiments, those members with the same functionalities are designated by the same reference characters or numerals and any repetitive explanation thereof will be eliminated therein.

Embodiment 1

Figure 2:
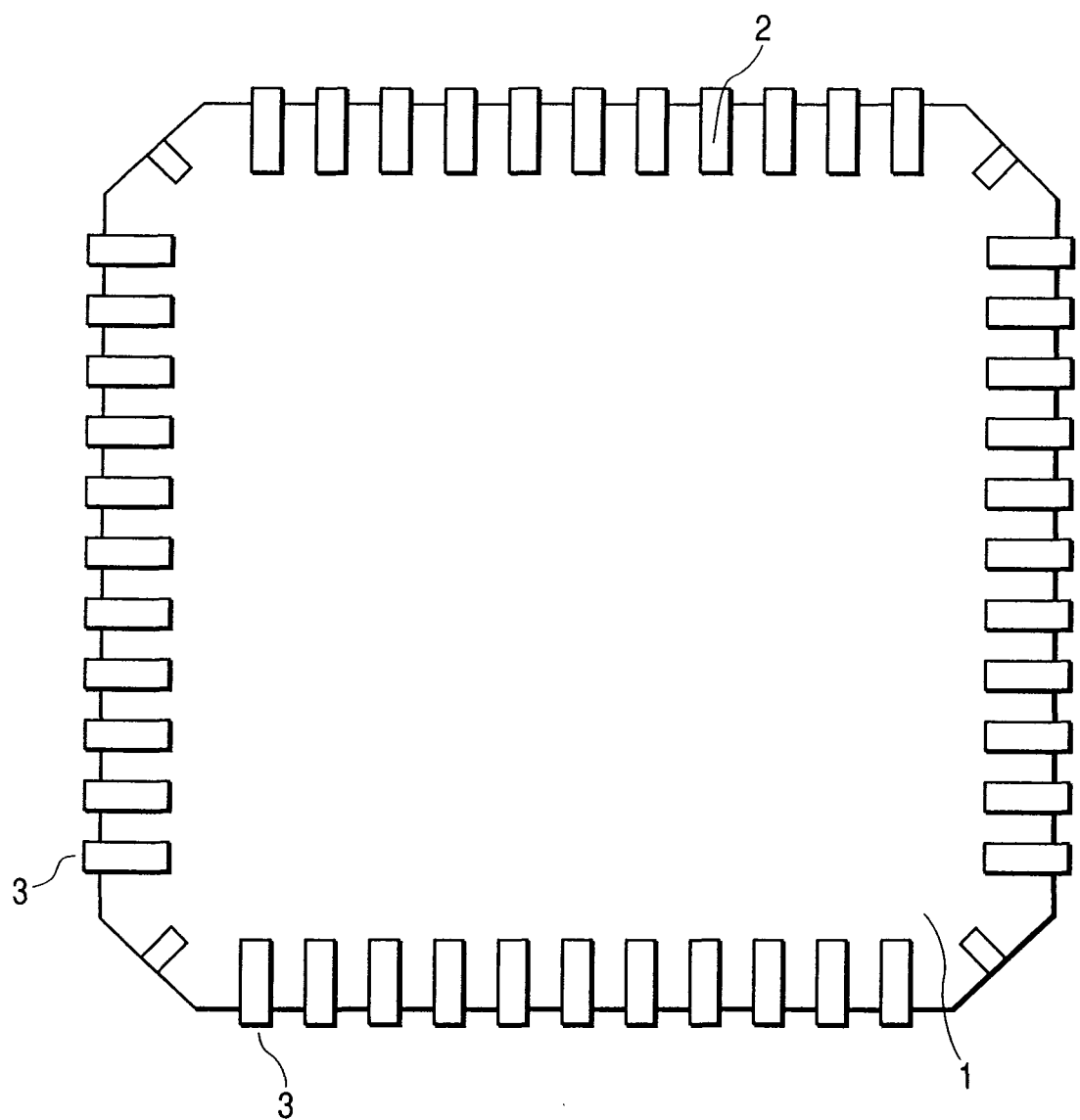
FIG. 2 shows a diagram of a plan view (lower surface side) of the semiconductor device shown in FIG. 1.
Figure 3:
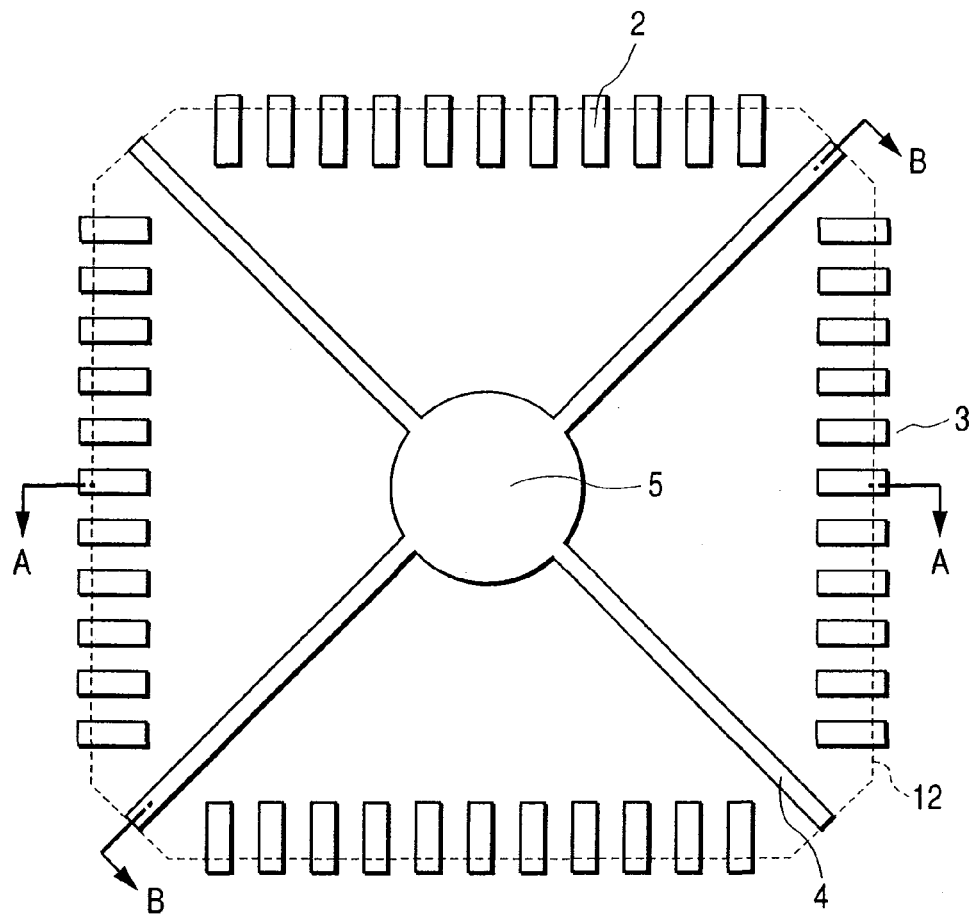
FIG. 3 shows a plan view of a unitary lead section of the embodiment 1 of the invention.
Figure 4:
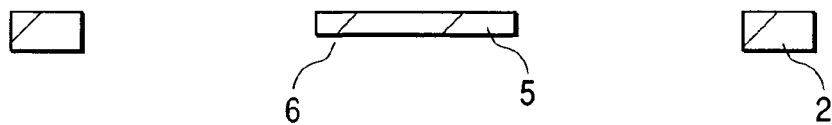
FIG. 4 shows a cross-sectional view of the unit lead section shown in FIG. 3 as taken along cutaway line A-A.
Figure 5:
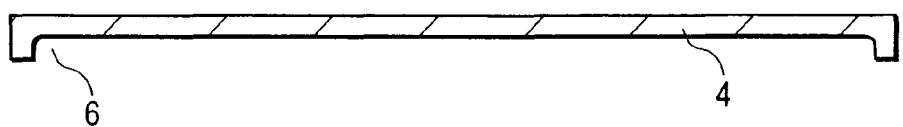
FIG. 5 shows a sectional view of the unit lead section shown in FIG. 3 taken along line B-B.
Figure 6:
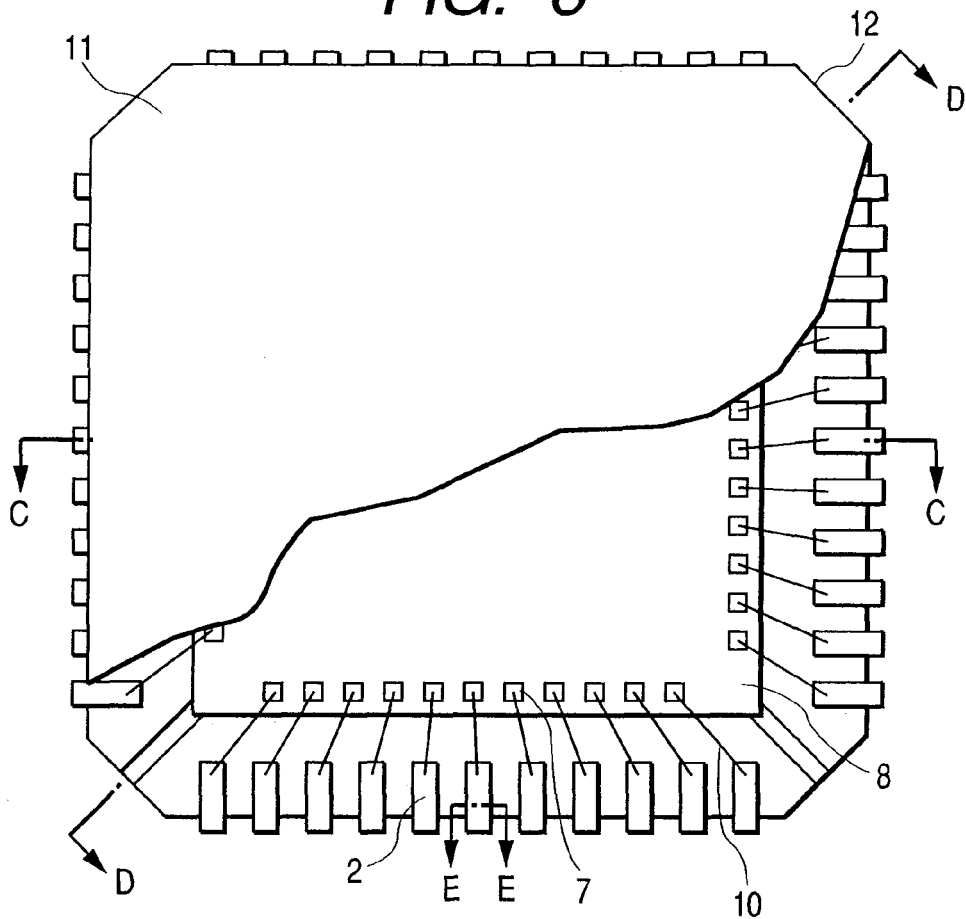
FIG. 6 shows a plan view of the semiconductor device shown in FIG. 1 as partly broken to make visible its internal configuration for illustration purposes only.
Figure 7:
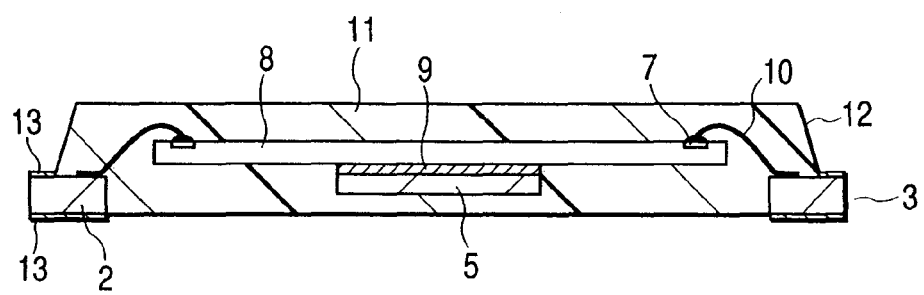
FIG. 7 shows a sectional view of the semiconductor device shown in FIG. 6 taken along line C-C.
Figure 8:
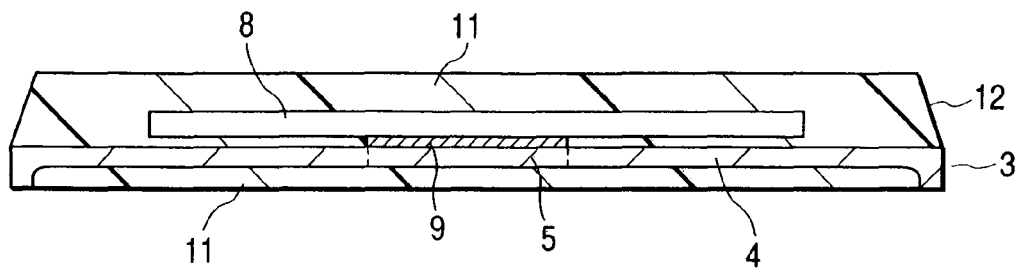
FIG. 8 shows a sectional view of the semiconductor device shown in FIG. 6 taken along line D-D.
Figure 9:
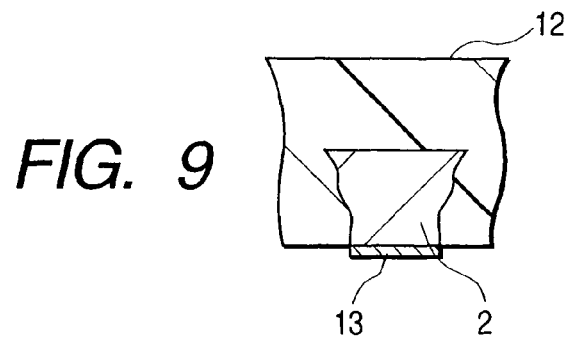
FIG. 9 shows a sectional view of the semiconductor device 1 shown in FIG. 6 taken along line E-E.
Figure 10A:
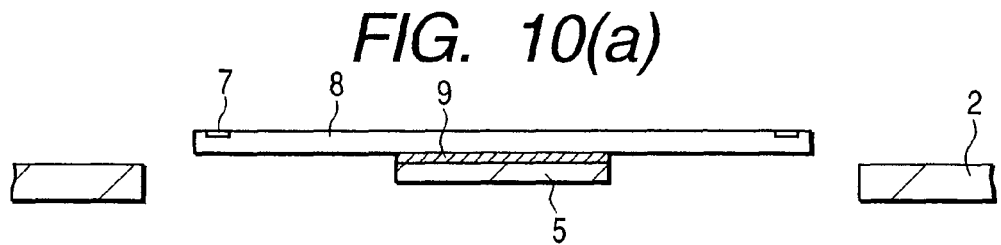
FIG. 10 shows a diagram of in cross-section a method of manufacturing the semiconductor device in accordance with the embodiment 1 of the invention.
Figure 10B:
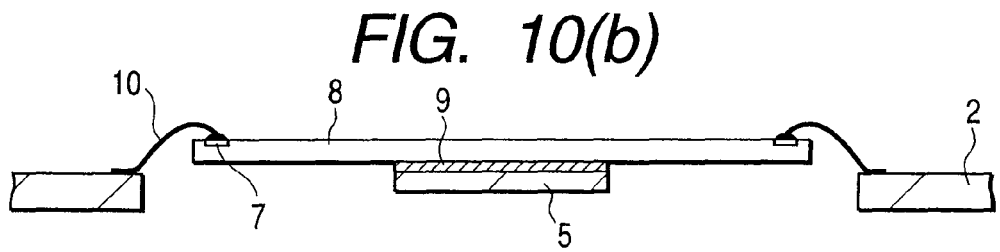
Figure 10C:
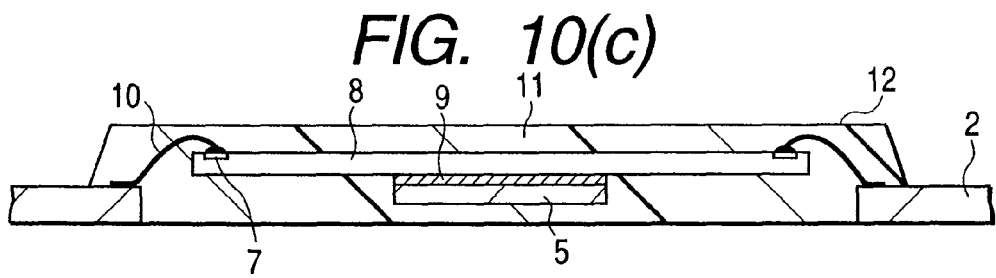
Figure 10D:
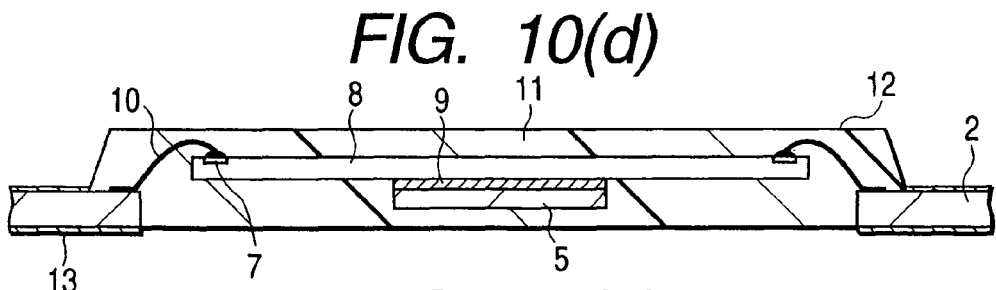
Figure 10E:
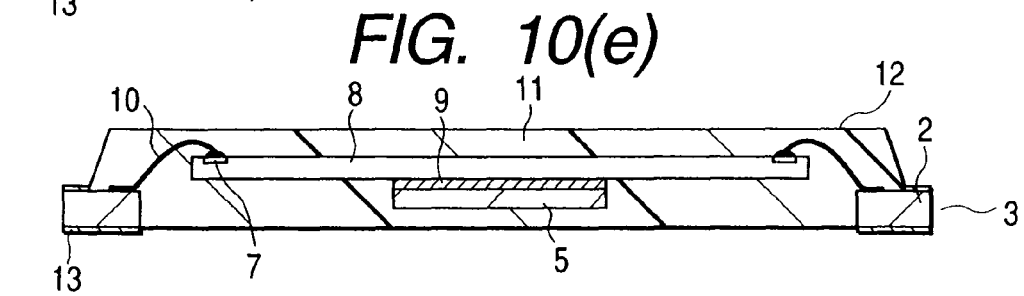

FIG. 1 is a diagram showing a perspective view of an exterior appearance of a semiconductor device in accordance with an embodiment 1 of the present invention; FIG. 2 is a diagram showing a plan view (lower surface side) of the semiconductor device; and FIG. 3 depicts a plan view of a unitary lead section (details will be described later) of the embodiment 1, wherein broken lines indicate a seal region. FIG. 4 is a cross-sectional view of the unit lead section of FIG. 3 as taken along line A-A; FIG. 5 is a sectional view of the unit lead section of FIG. 3 taken along line B-B; FIG. 6 is a plan view of the semiconductor device of FIG. 1 as partly broken to make visible its internal configuration for illustration purposes only; FIG. 7 is a sectional view of the semiconductor device of FIG. 6 taken along line C-C; FIG. 8 is a sectional view of the semiconductor device of FIG. 6 taken along line D-D; and, FIG. 9 is a sectional view of the semiconductor device 1 of FIG. 6 taken along line E-E.

As shown in FIGS. 1 and 2, the semiconductor device 1 of the illustrative embodiment 1 is a semiconductor device of the areal or "surface" mount type which is structurally arranged so that electrical leads 2 for use as external connection terminals are partly exposed at outer periphery of the semiconductor device on its lower surface side. This semiconductor device 1 includes a thin plate that is made of copper- or iron-based materials and machined to have a desired shape. As shown in FIGS. 3-5, this thin plate has a centrally disposed chip support paddle or die pad (also called "tab") 5 that is supported by four suspending leads (referred to as tab suspension leads hereinafter) 4 which are integrally formed with the "tab" pad 5, and a plurality of leads 2 laid out surrounding said tab 5. This thin plate will be referred to as a unit lead section 3 hereinafter.

The lower surface side of said tab suspension leads 4 (excluding outer end portions) and tab 5 is subjected to etching treatment so that the resultant thickness is approximately half of the thickness of other portions. This processing is generally called half-etching treatment. In this way, the unit lead section 3 of the embodiment 1 has on its lower surface side a stepped portion 6 due to such half-etching treatment. A semiconductor chip 8 is mounted on an upper surface (one principal surface) of the tab 5 of said unit lead section 3 as shown in FIGS. 6-8. The semiconductor chip 8 may include certain integrated circuitry such as a microcomputer, application-specific integrated circuit (ASIC), gate array, system large-scale integrated circuit (LSI), memory or the like, and a plurality of electrical connection pads 7 made of aluminum (Al) or other similar suitable conductive materials for use as external connection terminals of the integrated circuitry. The semiconductor chip 8 is rigidly bonded by adhesive 9 such as nonconductive paste or nonconductive films with the integrated circuitry facing upwardly.

Respective pads 7 of this semiconductor chip 8 are electrically connected to one principal surface of said leads 2 via conductive wires 10 made of gold (Au) or Al or else. Said semiconductor chip 8, wires 10, tab 5, tab suspension leads 4 and leads 2 (upper surface portions and side surface portions) are sealed by a sealing resin material 11 including but not limited to epoxy resin or silicon resin for the purposes of improvement in protectiveness and humidity resistivity. Note however that the lower surface portions (the other principal surface) of the leads 2 for use as external terminals are exposed on the lower side surface side of the semiconductor device.

Those portions sealed by the sealing resin 11 will be referred to hereafter as sealed portions 12. As seen from FIG. 9, a respective one of said leads 2 is specifically fabricated so that its upper surface is greater in area than the exposed lower surface in order to prevent unwanted dropdown detachment from the sealed portion 12 thereof.

In addition, in order to improve the humidity resistivity and also increase the parts mount abilities when mounting the semiconductor device 1 on its associative mount substrate, the leads 2 as exposed from the semiconductor device are subject to external packaging processing including but not limited to soldering metallization using Pb—Sn-based soldering processes.

A thin-film fabricated through external packaging processes will be referred to as metallized or metal-plated portion 13 hereafter. Said external packaging may also be done by metal-plating techniques using Pb free solder materials such as Sn—Ag or Sn—Zn-based ones. Designing said metal-plated portion to have a thickness of about 10 micrometers (μm) makes it possible for the semiconductor device 1 to retain a stand-off from the lower surface of the sealed portion 12, which corresponds to the thickness of the metal-plated portion 13. The plated portion 13 is not depicted in FIGS. 2 and 4 for purposes of convenience in illustration only.

In this way, the semiconductor device 1 of this embodiment is such that unlike the prior art with its stepped portion 6 formed by folding machining (up-set processing), the stepped portion 6 is formed by half-etching techniques thereby permitting the sealing resin 11 to exist at such locations; thus, it becomes possible to seal the tab 5 and tab suspension leads 4 with the sealing resin 11 while at the same time realizing the intended thickness-reduced structure, which in turn makes it possible to avoid the problem as to the degradation of reliability otherwise occurring due to a decrease in close contact or adhesiveness as resulted from a decrease in contact area between the sealing resin 11 and the tab 5.

Another advantage of the embodiment is that letting the lower surfaces of the leads 2 be exposed from the lower surface of the sealing section 12 of the semiconductor device 1 for use as external connection terminals makes it possible to prevent deformation of leads during carriage and/or mounting processes to thereby improve the reliability. In addition, as the leads 2 are projected by little degree from the side surfaces of the seal section 12, it is possible to achieve miniaturization or "shrinkage" of planar size of the semiconductor device 1. Additionally, as said leads 2 are arranged so that the upper surface sealed is greater in area than the lower surface exposed, sufficiently enhanced adhesiveness is obtainable to thereby enable retainment of increased reliability, irrespective of the fact that the effective bonding surface with respect to the seal resin 11 consists essentially of the upper and lower surfaces.

One example of a method of manufacturing the above-noted semiconductor device 1 in accordance with the embodiment 1 of the invention will next be explained with reference to a flow diagram of FIG. 10 along with FIGS. 11 to 21 below.

Figure 11:
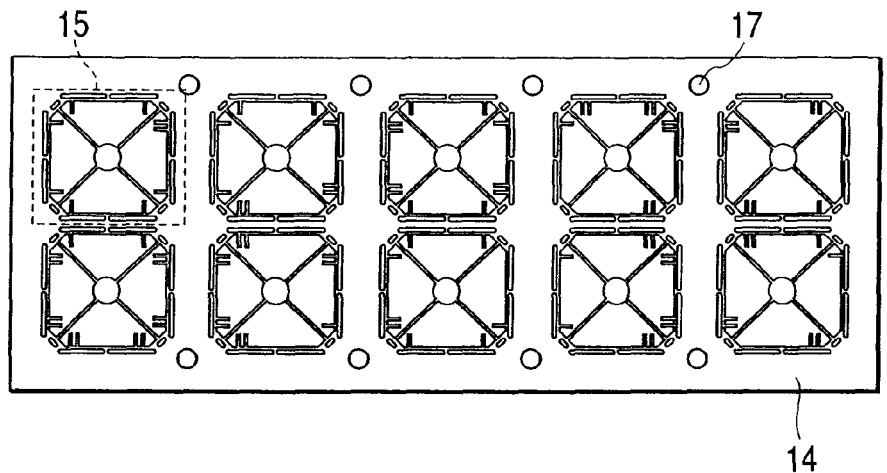
FIG. 11 shows a plan view of a matrix lead frame for use during manufacture of the semiconductor device in accordance with the embodiment 1 of the invention.
Figure 12:
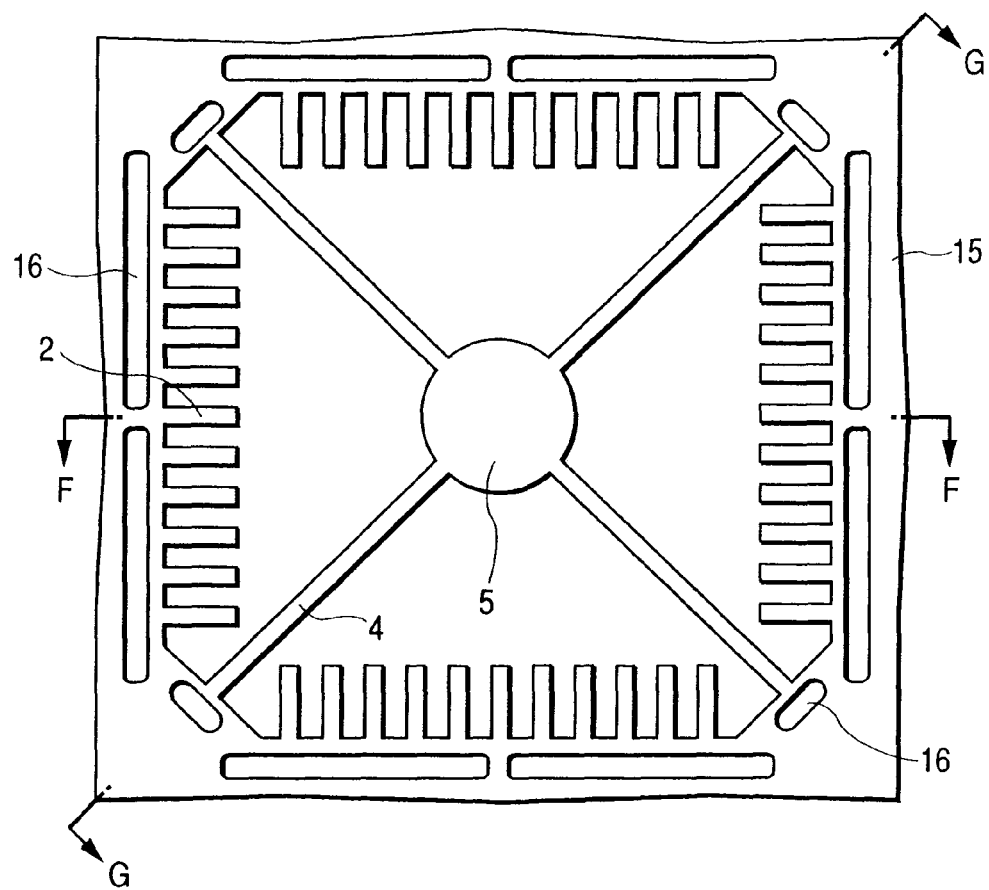
FIG. 12 shows an enlarged plan view of main part (upper surface side) of a unitary lead frame of the matrix lead frame shown in FIG. 11.
Figure 13:
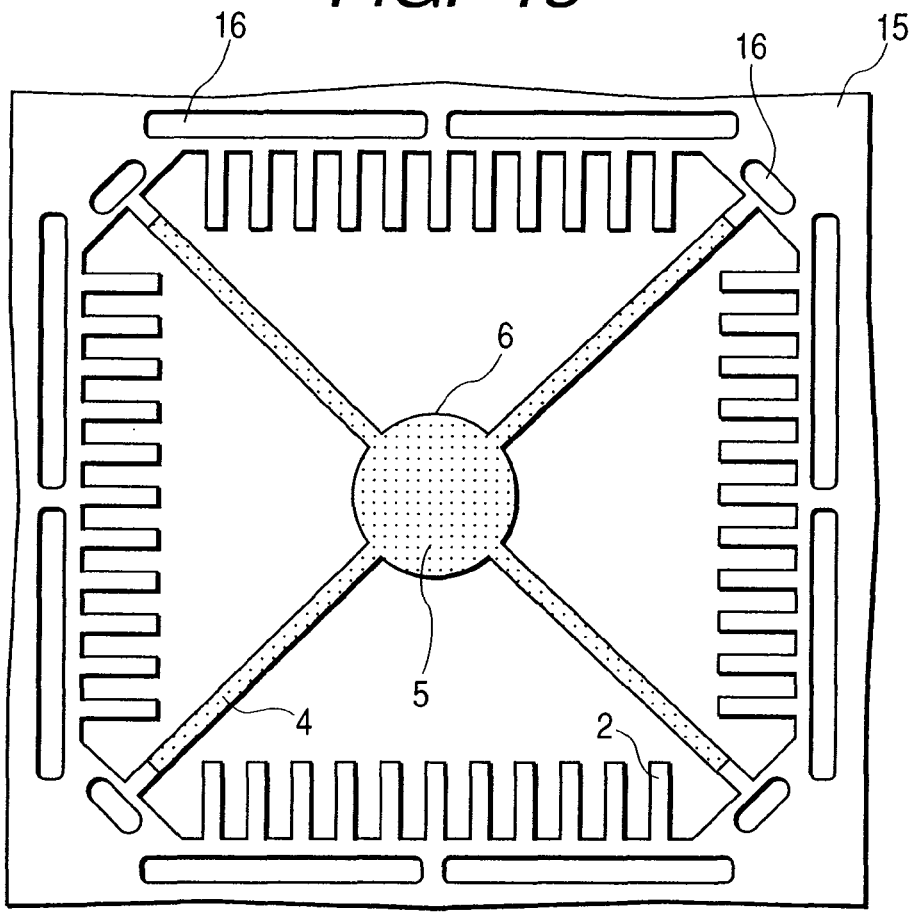
FIG. 13 shows an enlarged plan view of main part (lower surface side) of the unitary lead frame of the matrix lead frame shown in FIG. 11.
Figure 14:
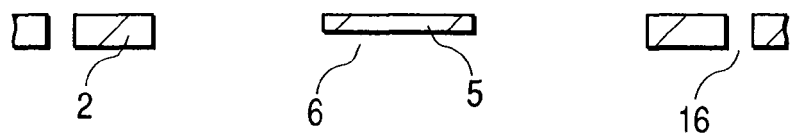
FIG. 14 shows a sectional view of the unit lead frame shown in FIG. 12 taken along line F-F.
Figure 15:
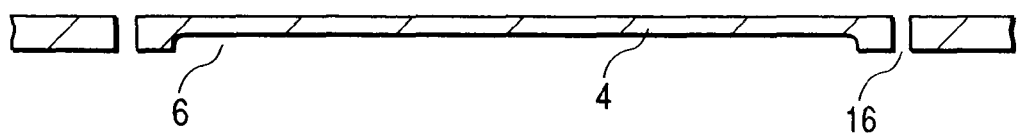
FIG. 15 shows a sectional view of the unit lead frame shown in FIG. 12 taken along line G-G.

FIG. 11 is a diagram showing a plan view of a matrix lead frame for use in the manufacture of the semiconductor device in accordance with said embodiment 1; FIG. 12 shows an enlarged plan view (upper surface side) of a unit Lead frame (details will be explained later) of the matrix lead frame of FIG. 11; FIG. 13 is an enlarged plan view (lower surface side) of the unit lead frame of the matrix lead frame of FIG. 11; FIG. 14 is a cross-sectional view of the structure of FIG. 12 as taken along line F-F; and, FIG. 15 is a sectional view of the structure of FIG. 12 taken along line G-G.

The matrix lead frame 14 shown herein is formed through patterning of a copper- or iron-based metal plate by etching techniques. As shown in FIG. 11, the matrix lead frame 14 is arranged so that a specified number of regions (referred to hereafter as unit lead frame 15) each corresponding to the surface area of a single semiconductor device 1 are formed thereon—here, ten separate equally spaced regions consisting of two rows extending in a direction along long sides and five columns along short sides, by way of example.

Additionally formed at the peripheral edges of each unit lead frame 15 is slits (referred to hereafter as stress relax slits 16) used for relaxation of stress forces as will possibly be applied to the matrix lead frame 14 during manufacturing processes, with guide pins 17 for use as supporting and position alignment pins during manufacturing being formed along the long sides of the matrix lead frame 14.

As shown in FIGS. 12-13, a tab 5 is centrally disposed over the unit lead frame 15 while being supported by its associated four tab suspension leads 4, wherein a plurality of leads 2 are provided at those locations in close proximity to the tab 5 in such a manner as to surround the tab 5, these leads being supported by the frame. The lower surface side of said tab suspension leads 4 (excluding outer end portions) and tab 5 is subjected to half-etching treatment so that the resultant thickness is about half of the thickness of other portions of the unit lead frame 15.

In this way the unit lead frame 15 of the embodiment 1 has a stepped portion 6 on its lower surface side as shown in FIGS. 14-15. This stepped portion 6 is not the one that is formed at a separate process step (referred to as after- or post-treatment hereafter) after completion of patterning using either punching or etching methods as in the prior art, but the one that permits simultaneous execution of both patterning and half-etching at a time; thus, it is possible to reduce costs for mass production of the matrix lead frame 14. Additionally the matrix lead frame 14 of the embodiment 1 does no longer require fold/bend machining processes applied to the matrix lead frame after completion of patterning as in the prior art, which in turn makes it possible to prevent occurrence of problems such as tab displacement/strain defects due to such bend/fold machining.

An explanation will next be given of a method of fabricating the matrix lead frame 14 shown in FIGS. 11-15 below.

Figure 16:
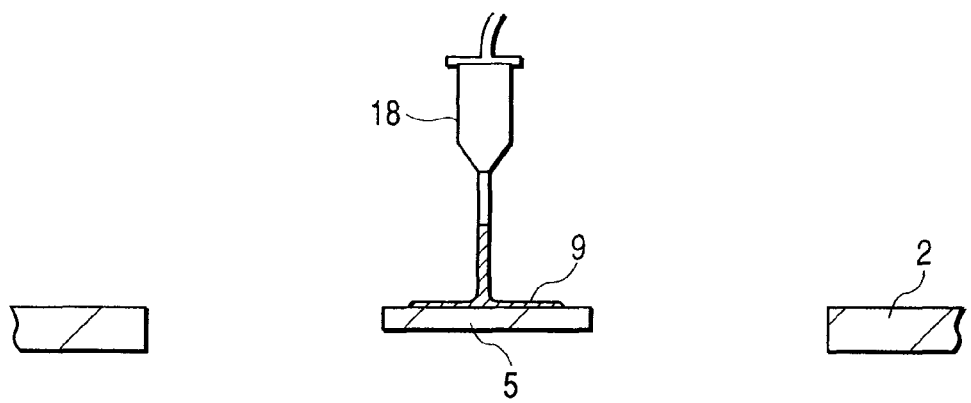
FIG. 16 shows a conceptual diagram showing a method of depositing an adhesive onto a tab at a die-bonding process step of the semiconductor device in accordance with the embodiment 1 of the invention.
Figure 17:
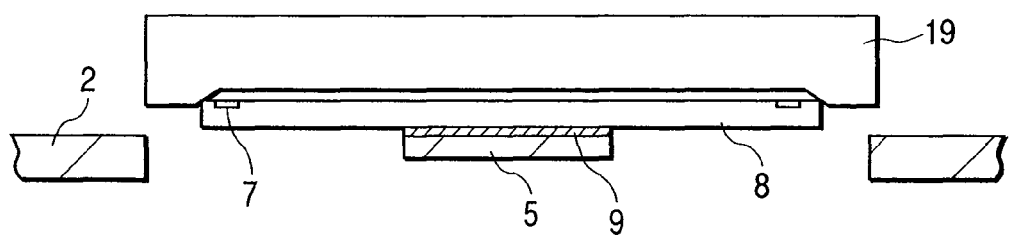
FIG. 17 shows a conceptual diagram showing a method of mounting a semiconductor chip on the tab at the die-bonding step of the semiconductor device in accordance with the embodiment 1 of the invention.
Figure 18:
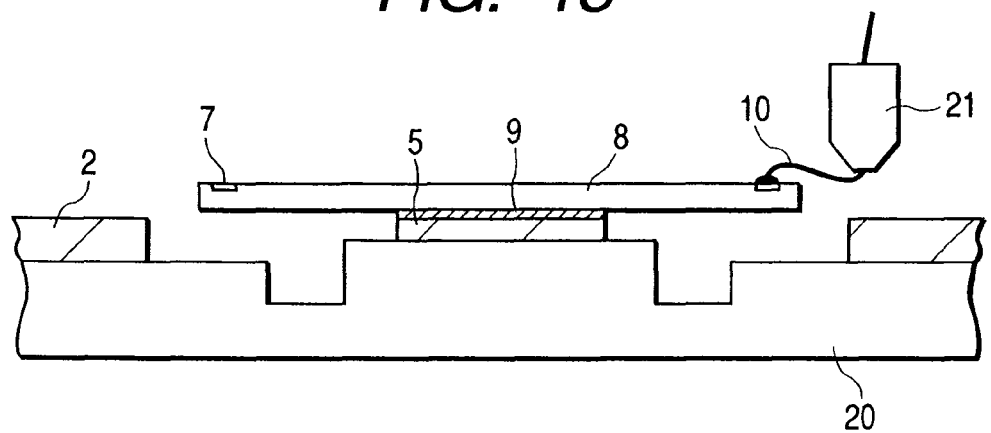
FIG. 18 shows a conceptual diagram showing a wire-bonding method of the semiconductor device in accordance with the embodiment 1 of the invention.
Figure 19:
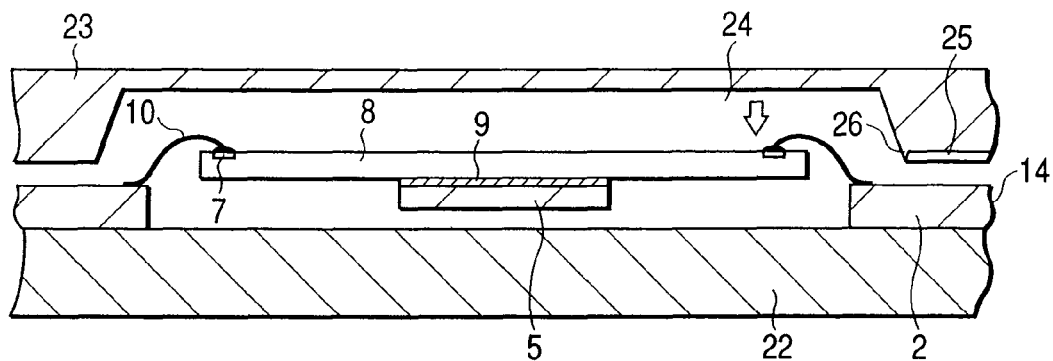
FIG. 19 shows a conceptual diagram showing a state in which a metal frame structure such as a metal tool and a matrix lead frame have been aligned in position with each other at a resin sealing process step of the semiconductor device in accordance with the embodiment 1 of the invention.
Figure 20:
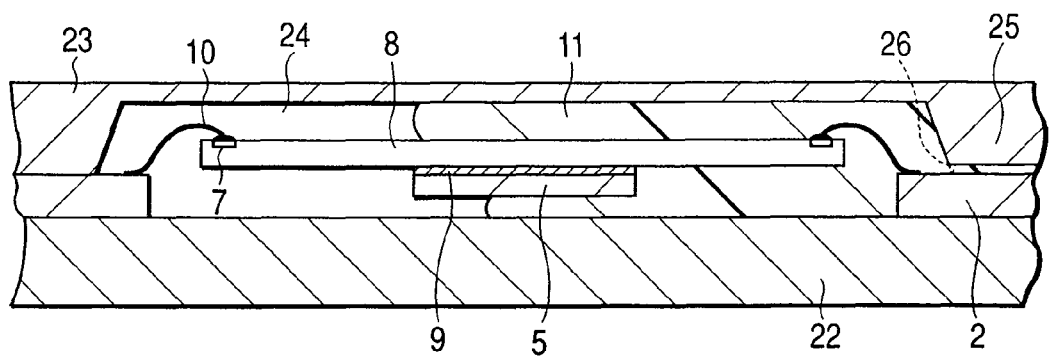
FIG. 20 shows a conceptual diagram showing a state in which the metal tool is clamped at the resin sealing step of the semiconductor device in accordance with the embodiment 1 of the invention.
Figure 21:
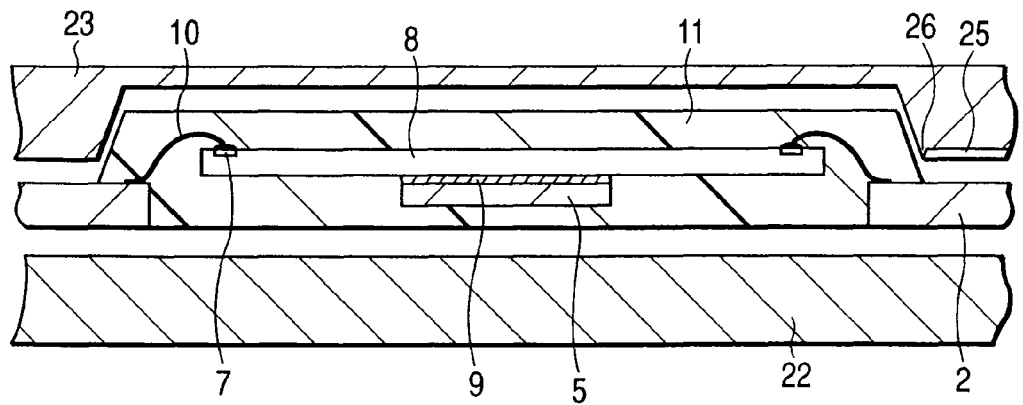
FIG. 21 shows a conceptual diagram showing a state in which the metal tool is disassembled at the resin sealing step of the semiconductor device in accordance with the embodiment 1 of the invention.

FIG. 16 is a conceptual diagram showing a method of depositing adhesive onto a tab; FIG. 17 is a conceptual diagram showing a method of mounting a semiconductor chip on the tab; FIG. 18 is a conceptual diagram showing a wire-bonding method; FIG. 19 is a conceptual diagram showing the state in which a metal frame structure such as metal tool and a matrix lead frame have been position-aligned at a resin sealing process step; FIG. 20 is a conceptual diagram showing the state in which the metal tool is clamped at the resin sealing step; and, FIG. 21 is a conceptual diagram showing the state in which the metal tool is disassembled at the resin sealing step.

Firstly, as shown in part (a) of FIG. 10, make use of an adhesive 9 such as conductive paste or nonconductive paste or nonconductive film or else to bond a semiconductor chip 8 to each tab 5 of the matrix lead frame 14. First, as shown in FIG. 16, deposit the adhesive 9 on each tab 5 by use of a syringe 18; thereafter, as shown in FIG. 17, use a collet 19 to mount the semiconductor chip 8 on each tab 5 with the adhesive 9 deposited thereon. This process step will be referred to as die bonding step hereinafter.

Next, as shown in part (b) of FIG. 10, let respective pads 7 of the semiconductor chip 8 be electrically connected to corresponding leads 2 by conductive wires 10 made of Au or the like. This process begins with a step of rigidly attaching the matrix lead frame 14 with the semiconductor chip 8 mounted thereon to a bonding stage 20 as heated up to high temperatures as shown in FIG. 18. Then, while retaining the rigid fixed state, electrically connect respective pads 7 of the semiconductor chip 8 by wires 10 made of Au or else to respective leads 2 of a corresponding unit lead frame 15 by using a capillary 21. This process will be referred to hereafter as wire bonding step.

Next, as shown in part (c) of FIG. 10, use a transfer molding method to seal upper surfaces and sidewall regions of the semiconductor chip 8 and wires 10 plus tab 5 along with tab suspension leads 4 (not shown) and leads 2 with a sealing resin material 11 including but not limited to epoxy resin or silicon resin. This process begins with a step of mounting the matrix lead frame 14 with the wire bonding applied thereto at a specified position of a lower metal mold tool 22 of transfer molding apparatus, thereby tightly clamping its upper metal tool 23 and lower metal tool 22 together. The both metal tools thus clamped have an inner space (referred to as cavity 24 hereafter) that is defined at a level corresponding to the mating surface thereof, which space permits the semiconductor chip 8 and wires 10 plus tab 5 along with tab suspension leads 4 (not shown) and leads 2 (upper. surface and side surface portions) to be sealed with the sealing resin 11.

Next, as shown in FIG. 20, while letting the metal tools be tightly clamped together, fill the sealing resin 11 into each said cavity 24 through a runner 25 and gate 26 which define a resin flow path. The seal resin 11 filled attempts to flow around the half-etched tab 5 and the stepped portion 6 of the lower surface of the tab suspension leads 4 (not shown) thereby air-tightly sealing the semiconductor chip 8, wires 10, tab 5, tab suspension leads 4 (not shown), and leads 2 (upper surface portions and side surface portions). At this time the lower surface of said leads 2 and the lower surface of the seal section 12 are on substantially the same plane while allowing the lower surface of leads 2 to be exposed from the lower surface of seal section 12.

Note here that it will be desirable that outer end portions of said leads 2 be projected outwardly from side surfaces of the sealing section 12 in order to facilitate cutting at cutting process steps. Thereafter, as shown in FIG. 21, the metal tool structure is disassembled. This process will be referred to hereafter as resin sealing step. Additionally, although the above-noted resin sealing step is illustratively designed to employ transfer molding methods, sheet molding methodology may alternatively be used for performing resin sealing while letting a thermal resistive sheet be uniformly spread covering the surfaces of the upper metal tool 23 and lower metal tool 22 and retaining such state. In this case the leads 2 are projected from the seal section 12 by a degree corresponding to an amount of sinkage into said sheet.

Next, as shown in part (d) of FIG. 10, execute external packaging of those leads 2 as exposed from the seal section 12 for the purposes of improvement in humidity resistivity and also improvement of mountability when mounting a semiconductor device onto a parts mount substrate. Preferably said external packaging is done by solder metallization techniques using Pb—Sn-based solder materials; however, other similar techniques may alternatively be employable, including but not limited to metallizing methods using Pb-free solders such as Sn—Ag-based, Sn—Zn-based ones. Designing said metal-plated portion 13 to have a thickness of about 10 permits the semiconductor device 1 to attain stand-off corresponding in dimension to the thickness of the metallized portion 13. Hereinafter, this process will be collectively called an external packaging process step.

Next, as shown in part (e) of FIG. 10, use a cutting metal mold structure (not shown) to cut the matrix lead frame 14 at specified positions lying slightly outside of each sealing section 12 thereby subdividing it into a plurality of unit lead sections 3 (those portions of the unit lead frame 15 with frames removed away therefrom) so that the semiconductor device 1 shown in FIG. 1 is thus obtained. This process will be collectively referred to as cutting step hereinafter.

Semiconductor devices 1 thus manufactured in the way stated supra are then subjected to a product screening delivery inspection/test procedure for separation of good products from defective ones, the former will be placed in condition for shipment. As apparent from the foregoing, the manufacturing method discussed above is free from a need to apply any fold/bending machining processes to external terminals of semiconductor devices under manufacture; thus, it is possible to make easier process management required therefor to thereby increase productivities. Another advantage is that in regard to almost all process steps, currently established semiconductor manufacturing apparatus or equipment may be employable without requiring any substantive modifications, which in turn makes it possible to greatly reduce or avoid risks as to new plant investment.

It should be noted that although in the manufacturing method stated above the external packaging is carried out by solder metallization techniques, the invention should not exclusively be limited thereto and may alternatively be modifiable in such a manner that a matrix lead frame 14 may be prepared which is such that external packaging treatment such as Pd metallization or the like has been applied in advance to those lead regions as exposed from semiconductor devices. In this case the external packaging process is no longer required during the manufacture of the semiconductor device 1 whereby the requisite number of process steps may be reduced thus increasing productivities accordingly.

It should also be noted that although the cutting process noted above is done by use of the cutting metal mold structure, this may alternatively be modified so that in a way similar to the process of dicing semiconductor chips out of a wafer, a dicing blade is used to cut into respective unit lead sections 3 after having applied a dicing tape onto the lower surface of the matrix lead frame 14. In this case, it becomes possible to attain the intended cutting at specified locations at or near the seal section 12 because of the absence of any structural limitations when compared to the case of cutting by using a cutting metal mold tool, thereby narrowing a gap distance between adjacent ones of the unit lead frames 15, which in turn makes it possible to improve the utilization efficiency of the matrix lead frame 14. In addition, since in this case the leads 2 are not projected from side surfaces of the seal section 12, it is possible for the resultant semiconductor device to decrease or "shrink" in planar dimensions in comparison with the case of cutting by using the cutting metal mold tool.

Additionally, although in the above noted manufacturing method the matrix lead frame 14 is prepared which has its stepped portion 6 as formed by half-etching techniques, the invention should not be limited only to this approach and may alternatively be modified so that a matrix lead frame 14 is prepared with its stepped portion 6 being formed through coiling patterning techniques.

Figure 22:
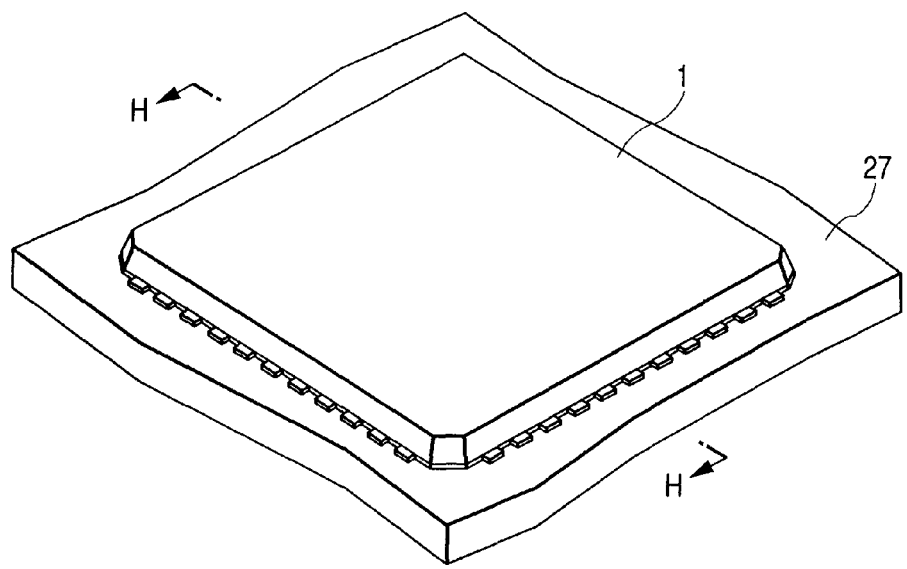
FIG. 22 shows a perspective view of an exterior appearance showing a state in which the semiconductor device in accordance with the embodiment 1 of the invention has been mounted to a parts mount substrate.
Figure 23:
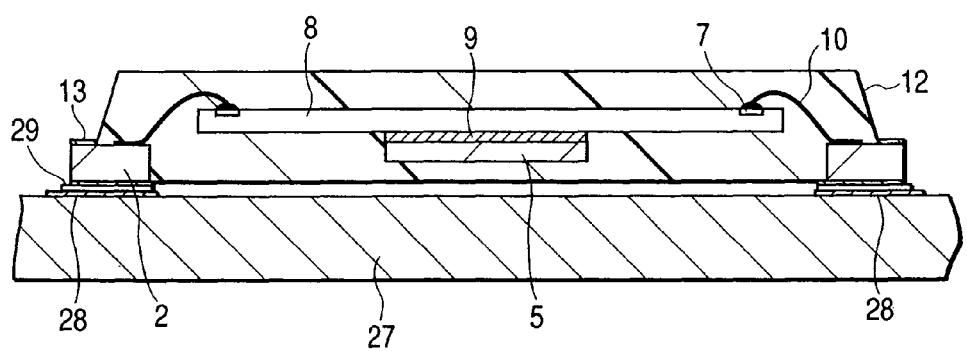
FIG. 23 shows a sectional view of the device structure of FIG. 22 taken along line H-H.

FIG. 22 is a diagram showing a perspective view of an exterior appearance showing the state that the semiconductor device in accordance with the embodiment 1 has been mounted to a parts mount substrate, and FIG. 23 is a sectional view of the device structure of FIG. 22 taken along line H-H. To mount this semiconductor device 1 onto the parts mount substrate 27, a method is employable which includes the steps of coating or "painting" a chosen bonding material such as cream solders or the like on leads 28 of the mount substrate 27 which correspond to those leads 2 on the lower surface of a sealing section 12 of the semiconductor device 1, temporarily attaching the semiconductor device 1 to the leads 28 of mount substrate 27 with the bonding material 29 coated thereon, and thereafter performing reflow processes in a heating furnace (not shown).

As shown in FIG. 23, the semiconductor device 1 of the embodiment 1 is as thin as 1 mm, or more or less, in height when mounted while simultaneously permitting its planar dimensions to be significantly smaller than those packages with leads projecting outwardly from lateral sides of a seal section, which packages typically include quad flat package (QFP) structures, thus enabling achievement of high-density mountabilities. It is also possible to prevent occurrence of any unwanted electrical shorting between the tab and leads on a parts-mount substrate because of the fact that each tab is not exposed from the lower surface of its associated semiconductor device unlike the prior art.

Embodiment 2

Figure 24:
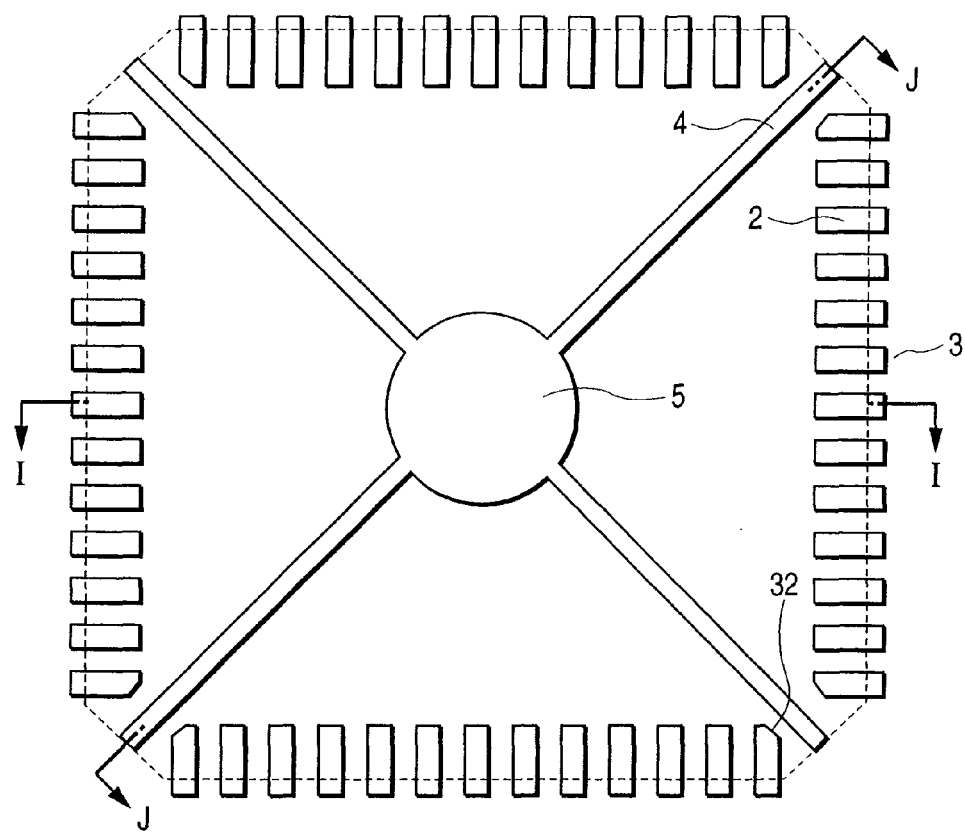
FIG. 24 shows a plan view of a unitary lead section of an embodiment 2 of the invention.
Figure 25:
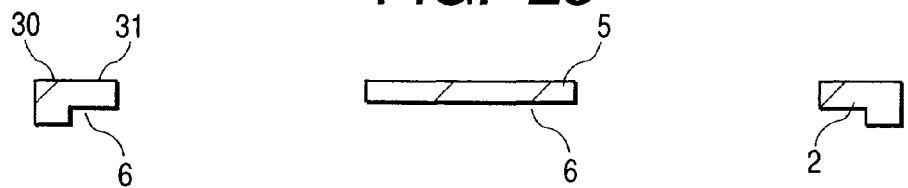
FIG. 25 shows a sectional view of the unit lead section shown in FIG. 24 take along line I-I.
Figure 26:
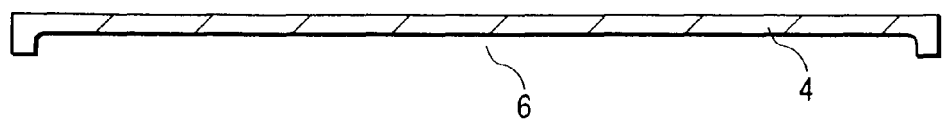
FIG. 26 shows a sectional view of the unit lead section shown in FIG. 24 take along line J-J.
Figure 27:
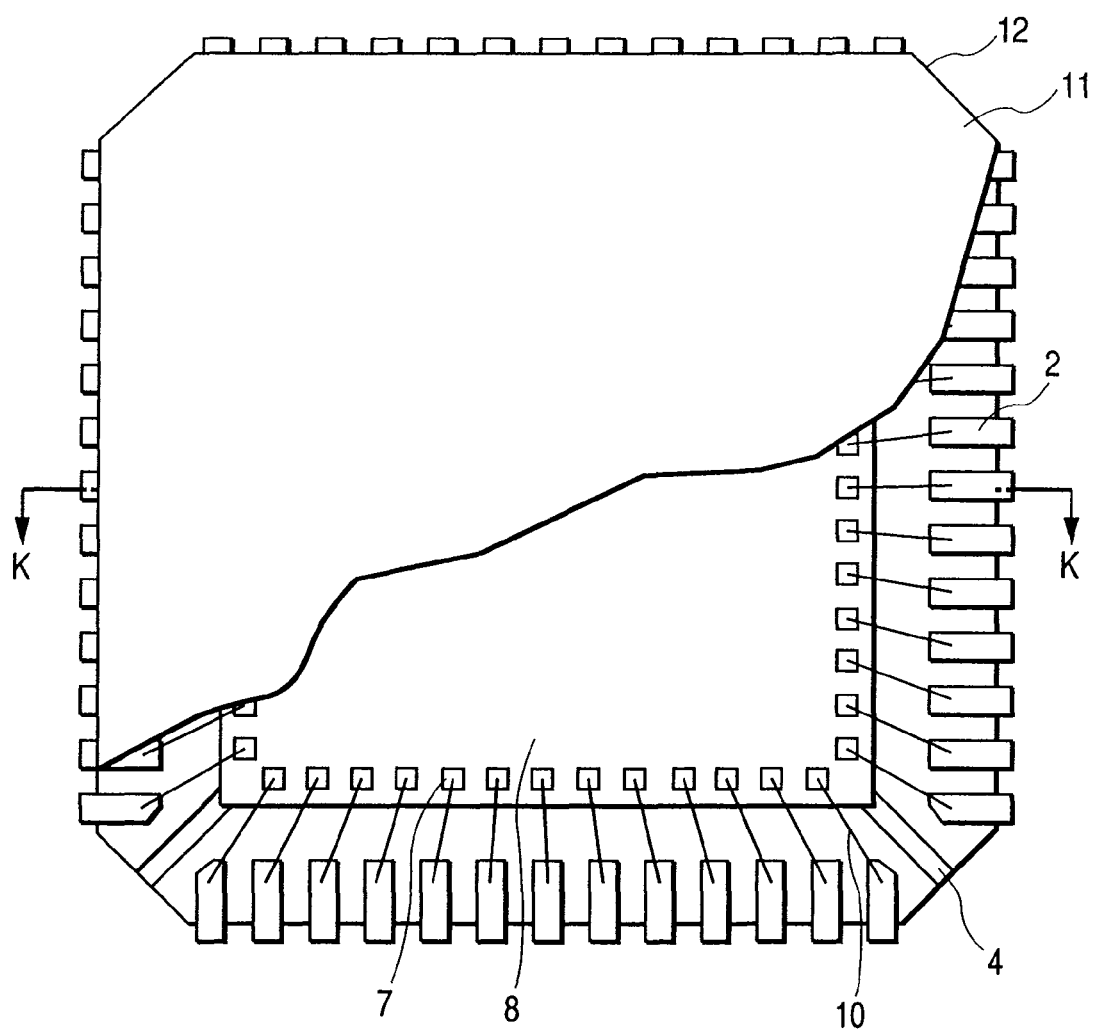
FIG. 27 shows a partial see-through diagram of a semiconductor device in accordance with the embodiment 2 of the invention.
Figure 28:
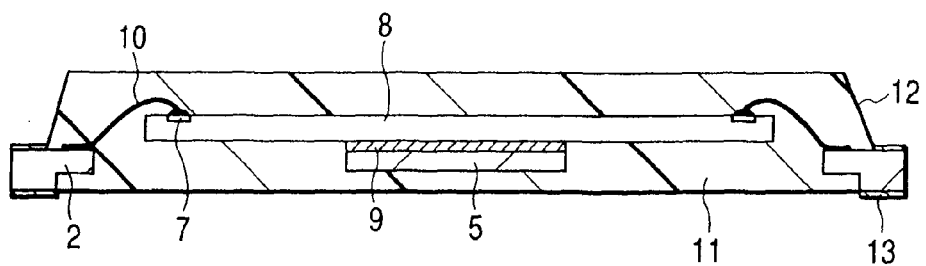
FIG. 28 shows a sectional view of the semiconductor device shown in FIG. 27 as taken along line K-K.
Figure 29:
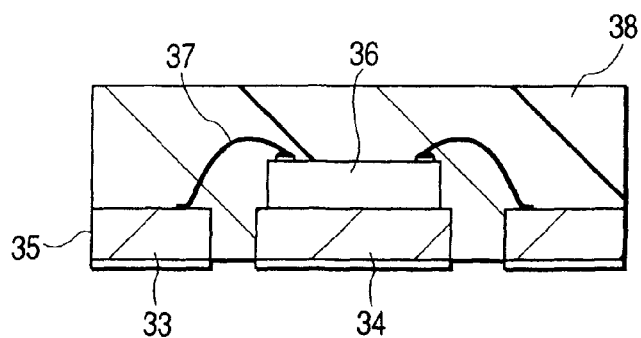
FIG. 29 shows a sectional view of the first prior art semiconductor device that has been already discussed in the introductory part of the description.
Figure 30:
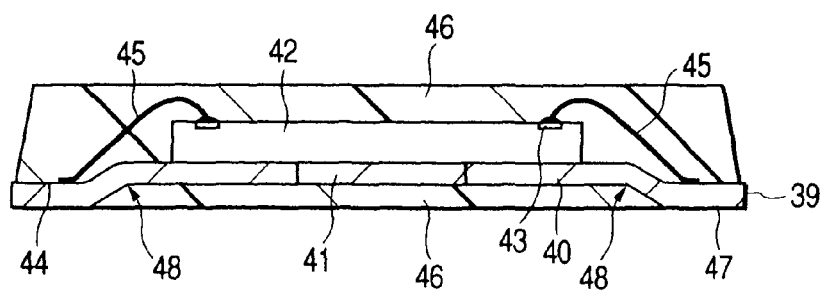
FIG. 30 shows a sectional view of the second prior art semiconductor device as also stated previously in the introductory part of the description.

FIG. 24 is a diagram showing a plan view of a unitary lead section of an embodiment 2 of the invention. Note that broken lines are used in FIG. 24 to indicate a seal region. FIG. 25 depicts a cross-sectional view of the unit lead section of FIG. 24 as take along line I-1; FIG. 26 is a sectional view of the unit lead section of FIG. 24 take along line J-J; FIG. 27 is a partial see-through-diagram of a semiconductor device in accordance with the embodiment 2; and, FIG. 28 is a sectional view of the semiconductor device of FIG. 27 taken along line K-K.

A difference of the embodiment 2 from embodiment 1 is that whereas the embodiment 1 is the structure capable of sealing each tab 5 and tab suspension leads 4 with the sealing resin 11 because of the presence of the stepped portion 6 on the lower surface side of such tab suspension leads 4 (excluding outer end portions) and tab 5, the embodiment 2 is arranged to have another stepped portion 6 at distal end portions on the tab 5 side of the leads 2 (referred to hereafter as inner end portions 31) in addition to the lower surface side of the tab suspension leads 4 (excluding outer end portions) and tab 5, thereby making it possible to seal the inner end portions 31 of leads 2 in addition to such tab 5 and tab suspension leads 4. The remaining parts of the embodiment 2 are substantially the same as those of the embodiment 1; thus, only different points will be explained below, and an explanation as to such similar points will be eliminated herein.

As shown in FIGS. 24 to 26, a unit lead section 3 of the embodiment 2 has a centrally located tab 5 that is supported by four tab suspension leads 4, wherein a plurality of leads 2 are provided to surround said tab 5. Said tab suspension leads 4 (excluding external end portions) and the tab 5 plus inner end portions 31 of the plurality of leads 2 are subjected to half-etching treatment to have a thickness about half of that of the other portions.

Additionally, in order to prevent accidental contact between the leads 2 and tab suspension leads 4, bevel machining is applied to respective leads 2 lying nearest to the tab suspension leads 4 at their corner edges 32 opposing the tab suspension leads 4. As shown in FIGS. 27-28, a semiconductor chip 8 is mounted and secured on the tab 5 by adhesive 9 such as nonconductive paste or nonconductive film or else. This semiconductor chip 8 has respective pads 7 which are electrically connected to said plurality of leads 2 via conductive wires 10 made of Au or Al or the like.

It is noted that the semiconductor chip 8, wires 10, tab 5, tab suspension leads 4 and leads 2 (upper surface portions and side surface portions plus lower surfaces of inner end portions) are sealed by a sealing resin material 11 including but not limited to epoxy resin or silicon resin for the purposes of improvement in protectiveness and humidity resistivity. Note however that the lower surfaces of outer end portions 30 of the leads 2 for use as external connection terminals are exposed on the lower surface side of the semiconductor device 1. In this way, the semiconductor device 1 of the embodiment 2 is arranged so that the inner end portions 31 of the leads 2 are subjected to half-etching treatment to form a stepped portion 6 which is then sealed by the sealing resin 11, thereby enabling the inner end portions 31 of leads 2 to have relatively free shapes.

More specifically, the lower surfaces of the leads 2 as exposed from the seal section 12 are limited in shape to those based on standards and regulations of the Electronic Industries Association of Japan (EIAJ); however, in regard to the leads 2 within the seal section 12, no specific standards are present thus making it possible to freely design the shape and lead pitch values thereof into optimal ones in a way pursuant to the size of semiconductor chip 8 and also the number of pads used.

The embodiment 2 offers similar advantages to those of the embodiment 1 in that i) it has the stepped portion 6 as formed by half-etching treatment, ii) the sealing resin 11 is capable of being exist at such location, iii) the lower surfaces of the leads 2 are exposed from the lower surface of the semiconductor device 1 for use as external connect terminals, and iv) the leads 2 are projected by a very little amount from side surfaces of the seal section 12; in addition, regarding the inner end portions 31 of the leads 2, it is possible to appropriately design the shape and lead pitch values thereof into optimal ones in a way pursuant to the size of semiconductor chip 8 and also the number of pads because of the fact that the stepped portion 6 is formed by half-etching techniques on the lower surfaces of the inner end portions of leads 2 and is then sealed by the seal resin 11.

Embodiment 3

Figure 31:
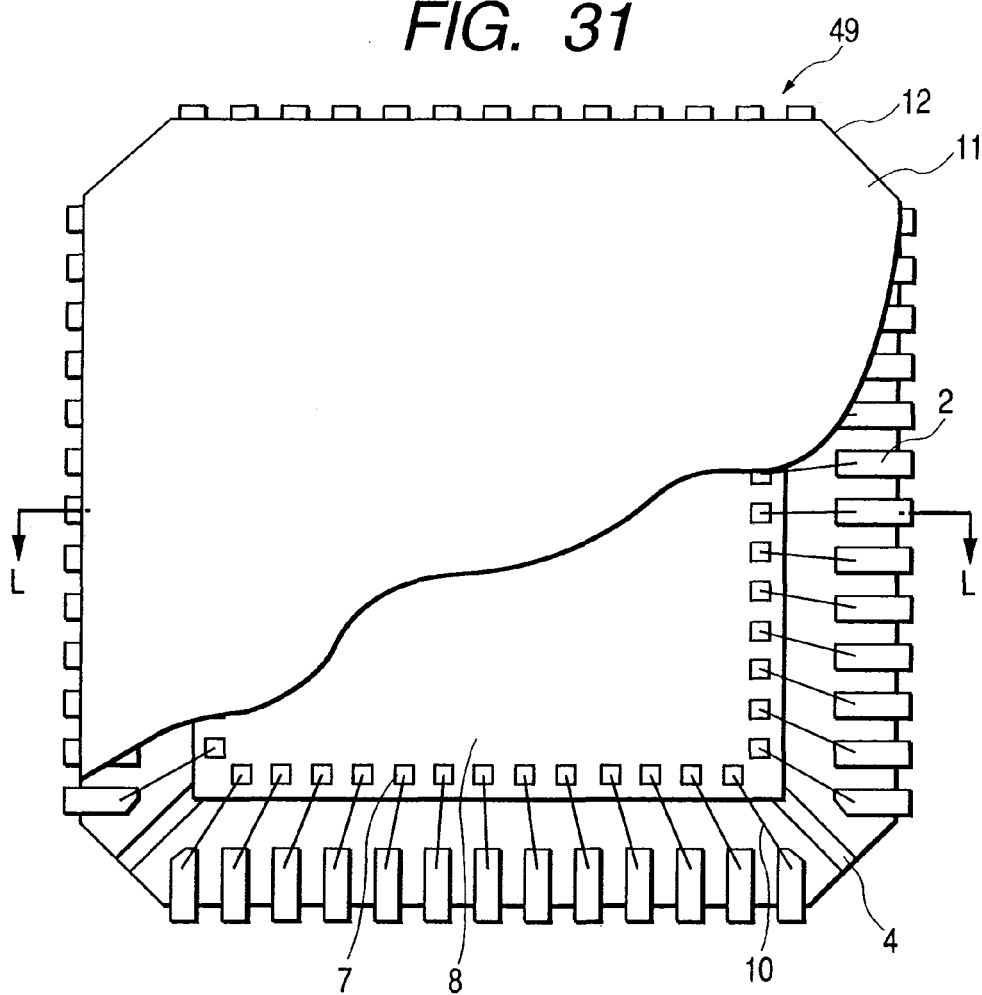
FIG. 31 shows a plan view of an exemplary semiconductor device in accordance with an embodiment 3 of the invention as partly broken at its sealing section to render visible its internal configuration for illustration purposes only.
Figure 32:
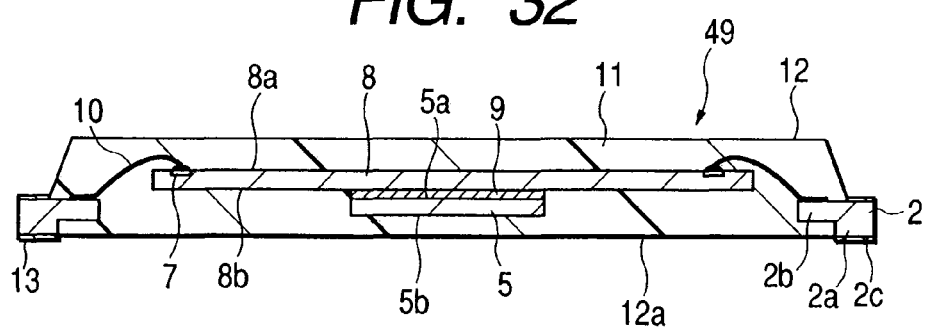
FIG. 32 shows a sectional view of the semiconductor device shown in FIG. 31 as taken along line L-L.
Figure 33:
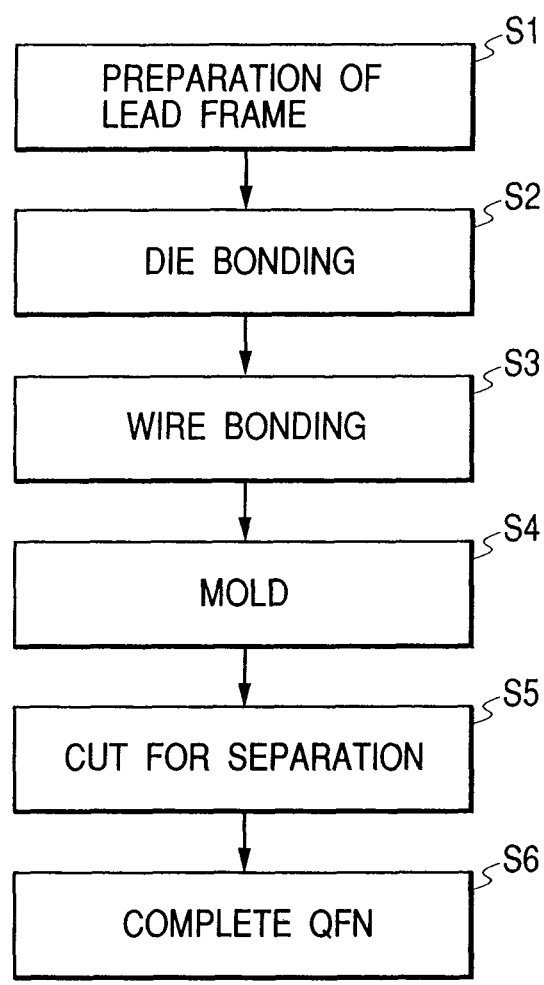
FIG. 33 shows a process flow diagram showing an example of the procedure for assembly of the semiconductor device shown in FIG. 31.

FIG. 31 is a diagram showing a plan view of an exemplary semiconductor device in accordance with an embodiment 3 of the present invention while letting a sealing section be partly broken to make visible its internal configuration for illustration purposes only; FIG. 32 depicts a cross-sectional view of the semiconductor device shown in FIG. 31 as taken along line L-L; FIG. 33 is a process flow diagram showing an example of the procedure for assembly of the semiconductor device shown in FIG. 31; and, FIGS. 34 (a) to (e) are sectional flow diagrams showing an exemplary structure per main process step in the assembly of the semiconductor device shown in FIG. 31.

The semiconductor device of the embodiment 3 is generally similar to the semiconductor device as set forth in conjunction with the embodiment 2 discussed above, and is a quad flat non-leaded (QFN) package 49 of the peripheral type with a plurality of leads 2 being disposed at the periphery of a back surface 12a of its sealing section 12 (semiconductor device mounting surface side).

Accordingly, only characteristic portions of the QFN package 49 will be explained here, and any explanation as to the same portions as those of the embodiment 2 will be eliminated.

The QFN package 49 is structurally arranged to include a tab 5 supporting thereon a semiconductor chip 8, a sealing member 12 with the semiconductor chip 8 sealed by resin, tab suspension leads 4 for support of the tab 5, a plurality of leads 2 which are disposed around the tab 5 and exposed to a back surface 12a of the sealing member 12 while having a thickness-increased portion 2a and thickness-reduced portion 2b thinner than the portion 2a for formation of a stepped portion with respect to a thickness direction, wires 10 which are connecting members for electrical connection between bonding pads (electrodes) 7 of the semiconductor chip 8 and those leads 2 corresponding thereto, and an adhesive 9 such as silver paste for use in bonding the semiconductor chip 8 and tab 5 together.

More specifically, in the QFN package 49 shown in FIGS. 31-32, the thickness-increased or "thick" portion 2a and thickness-reduced or "thin" portion 2b are provided at a respective one of the leads 2 disposed at the periphery of the back surface 12a of sealing member 12 whereby the thick portion 2a of such lead 2 is exposed to the periphery of the back surface 12a of sealing member 12 while causing the thin portion 2b to be covered or coated with a sealing resin material 11.

In short, the leads 2 are each formed to provide the thin portion 2b that is less in thickness than the thick portion 2a, wherein one of them—i.e. thick portion 2b to which a wire 10 is to-be-connected—is buried in the sealing member 12 to function as an inner lead whereas the other, i.e. thick portion 2a, has its surface exposed to the back surface 12a of such sealing member 12, which is for use as a to-be-connected portion 2c functioning as an outer lead.

Figure 37:
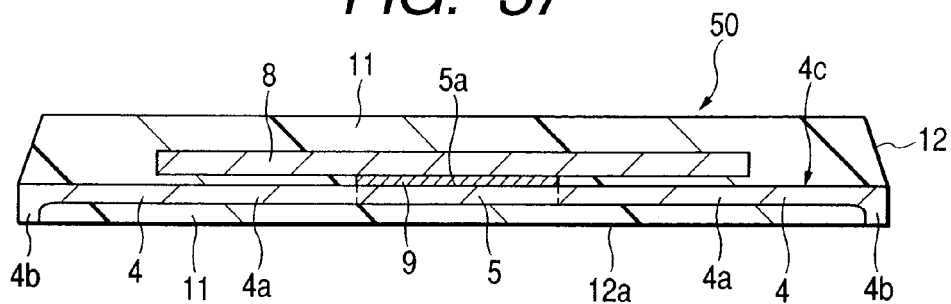
FIG. 37 shows a sectional view of the semiconductor device shown in FIG. 35 taken along line M-M.

Additionally in the QFN package 49, the tab 5 is supported by the tab suspension leads 4, and, as shown in FIG. 37 regarding the embodiment 4 as described below, the tab suspension leads 4 are designed to have a support portion 4a supporting the tab 5 and more than one exposed portion 4b that is coupled thereto and is exposed to the back surface 12a of the sealing member 12, wherein the support portion 4a is formed to be thinner than the exposed portion 4b.

In addition, these plurality of tab suspension leads 4 are coupled together via the tab 5, and the exposed portion 4b of tab suspension leads 4 is the same in thickness as the thick portion 2a of leads 2.

Specifically, a respective one of the plurality of tab suspension leads 4 consists essentially of a support section 4a that is coupled to the tab 5 and is substantially the same in thickness as this tab 5 and more than one exposed portion 4b that is coupled to this support section 4a and is greater in thickness than the support section 4a while causing the plurality of tab suspension leads 4 to be integrally coupled together via the tab 5. Accordingly, the tab suspension leads 4 are each provided with a step-like level difference due to the presence of such thick portion (exposed section 4b) and thin portion (support section 4a) with the plurality of tab suspension leads 4 being linked together via the tab 5.

Whereby, the support section 4a at the tab suspension leads 4 is buried or embedded within the sealing member 12 whereas the exposed section 4b is exposed at corner end portions of the back surface 12a of the sealing member 12.

It should be noted that fabrication of a step-like difference due to the presence of the thick portion 2a and thin portion 2b at leads 2 of QFN package 49 (patterning for formation of thick portion 2b) and fabrication of a step-like difference due to the support section 4a and exposed sections 4b at tab suspension leads 4 (patterning for formation of support section 4a) may be performed by etching techniques (e.g. half-etching treatment) as in an embodiment 11, to be described later in the description, or alternatively by press machining such as coiling process as in such later-discussed embodiment 11, by way of example.

An explanation will next be given of an assembly method of the QFN package 49 with reference to a process flow diagram shown in FIG. 33 along with sectional flow diagrams shown in FIG. 34.

Firstly, prepare a matrix lead frame 14 (see FIG. 11) which is a lead frame comprising a tab 5 capable of supporting a semiconductor chip 8, tab suspension leads 4 having a support section 4a supporting the tab 5 and more than one exposed section 4b that is coupled to the support section 4a and is greater in thickness than support section 4a, a plurality of leads 2 as laid out around the tab 5 with a thick portion 2a and thin portion 2b thinner than portion 2a for formation of a step-like difference or stepped portion with respect to the thickness direction (at step 51).

Figure 34A:
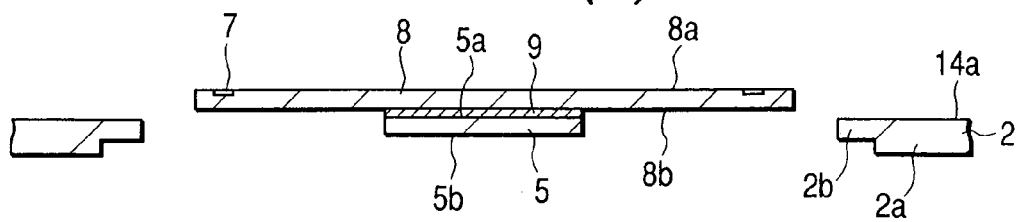
FIG. 34 shows parts (*a*), (*b*), (*c*), (*d*) and (*e*) are sectional flow diagrams showing an exemplary structure per main process step in the assembly of the semiconductor device shown in FIG. 31.

Subsequently, after having coated or "painted" an adhesive 9, adhere the tab 5 and semiconductor chip 8 together as shown in FIG. 34(a). More specifically, perform die bonding for fixation of the semiconductor chip 8 to the tab 5 via the adhesive 9 as coated on the tab 5 (step 52).

Figure 34B:
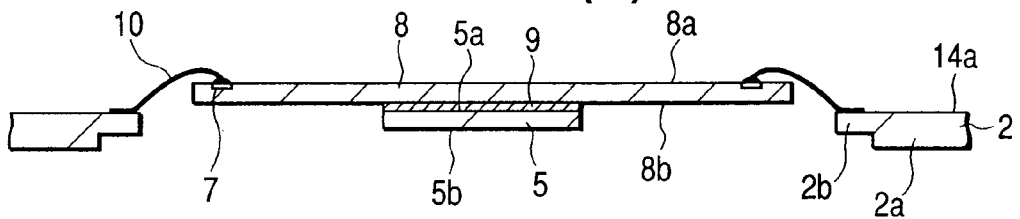

Further, as shown in FIG. 34(b), perform wire bonding as shown at step S3 for connection between pads 7 of the semiconductor chip 8 and their corresponding leads 2 by use of wires 10 that are employed as interconnect members.

Here, use wire bonding techniques to connect the pads 7 of semiconductor chip 8 to thin portions 2b of corresponding leads 2 via wires 10 made of gold or else.

Figure 34C:
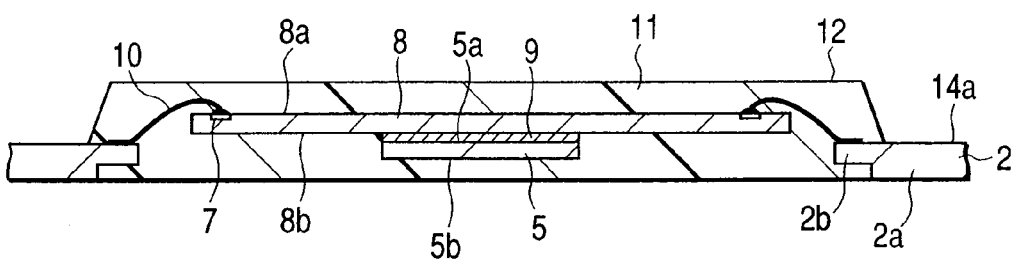

Thereafter, perform molding as shown at step S4 thereby forming a sealing member 12 as shown in FIG. 34(c).

During said bolding, the semiconductor chip 8 is resin-molded by a method including the steps of covering both the thin portions 2b of leads 2 and the support section 4a of tab suspension leads 4 with a sealing resin material 11 while letting such seal resin 11 flow onto a, surface (referred to hereafter as back surface 5b) on the opposite side to a chip support surface 5a of the tab 5, with the thick portions 2a of the plurality of leads 2 and the exposed portions 4b of tab suspension leads 4 being disposed at the periphery on the back surface 12a.

Whereby, the semiconductor chip 8 and wires 10 along with the tab 5 and support section 4a supporting the tab 5 plus the thin portions 2b of leads 2 are buried in the sealing member 12.

Figure 34D:
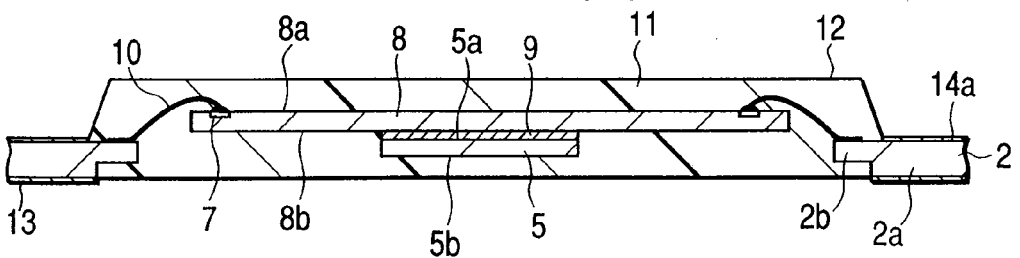

Thereafter, as shown in FIG. 34(d), apply external packaging processing to the leads 2 that are exposed on the back surface 12a of the sealing member 12 for the purpose of improvement in mountability when mounting the QFN package 49 on a mount substrate 27 (see FIG. 23). This makes it possible to insure the stand-off corresponding to the thickness of a metallized portion(s) 13. Note here that although said external packaging is preferably done by solder metallization techniques using Pb—Sn-based solders, other metallization methods using Pb-free solders such as Sn—Ag or Sn—Zn-based soldering materials may also be employable when the need arises.

Thereafter, cutting is done as shown at step 55.

Figure 34E:
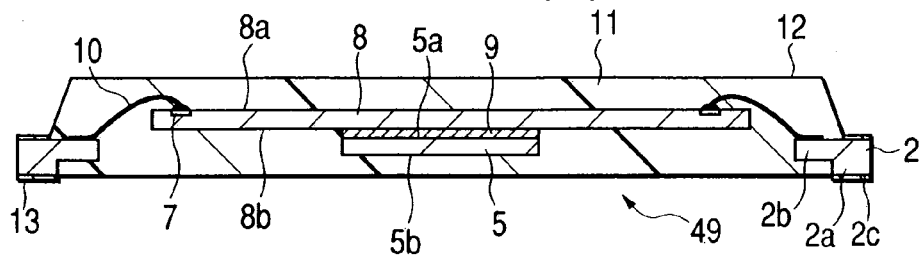

Here, subdivide the tab suspension leads 4 into portions at the exposed portions 4b of tab suspension leads 4 while substantially simultaneously separating the plurality of leads 2 from a frame section 14a of the matrix lead frame 14 (lead frame), thus completing the QFN package 49 as shown in FIG. 34(e) (at step S6).

In accordance with the QFN package 49 of the embodiment 3 and its manufacturing method stated supra, it is possible, by providing the step-like difference, i.e. the thick portion 2b and thin portion 2a, at the leads 2 while letting the thin portion 2b be embedded within the sealing member 12, to prevent accidental dropdown detachment of leads 2 from the sealing member 12 in a direction along the height of the QFN package, which in turn makes it possible to prevent unwanted pull-out or discomposition of such leads 2 from the sealing member 12.

In addition, it is possible to set metal mold's clamp planes at the same surface level during molding, because of the fact that the exposed sections 4b which are exposed portions of the tab suspension leads 4 and the thick portions 2a which are exposed portions of the leads 2 are formed to have the same thickness.

More specifically, in cases where the exposed portions of the tab suspension leads 4 (exposed portions 4b) and exposed portions of the leads (thick portions 2a) are different in thickness from each other, the sealing resin material 11 can flow into the thinner part side resulting in occurrence of a need to cut both metals and resin (sealing resin 11) together at a lead cut process step thus leading to risks of creation of defects; on the contrary, if the exposed portions 4b of tab suspension leads 4 and the thick portions 2a of leads 2 are formed to have the same thickness then the sealing resin 11 will no longer be disposed at cutting locations, which in turn makes it possible to facilitate smooth effectuation of the intended lead cutting processes.

Thus, it is possible to suppress creation of defects during lead cutting processes.

Embodiment 4

Figure 35:
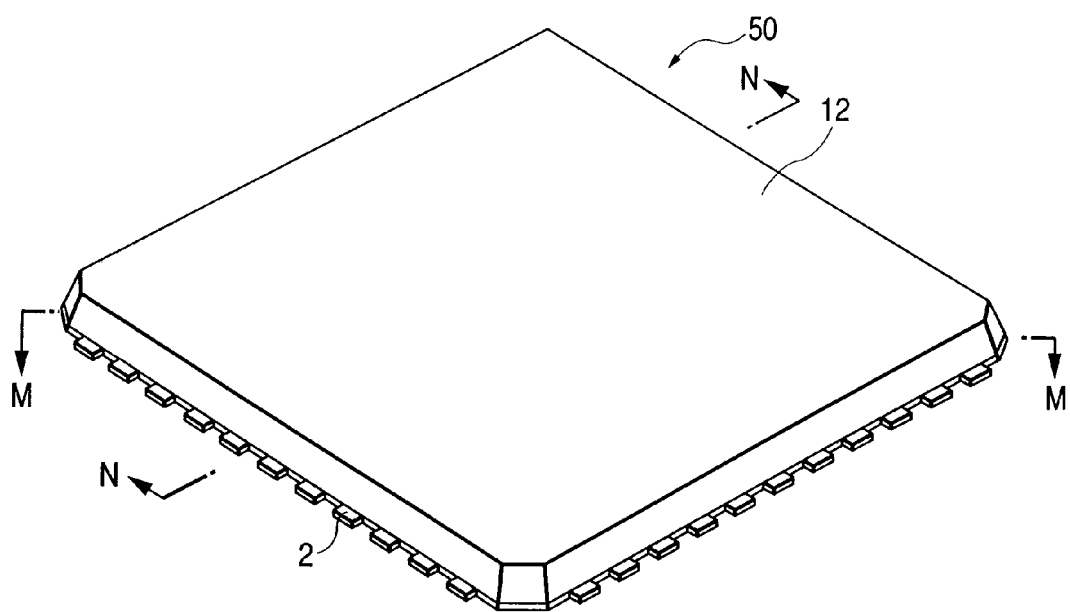
FIG. 35 shows a perspective view of an exterior appearance showing an example of the structure of a semiconductor device in accordance with an embodiment 4 of the invention.
Figure 36:
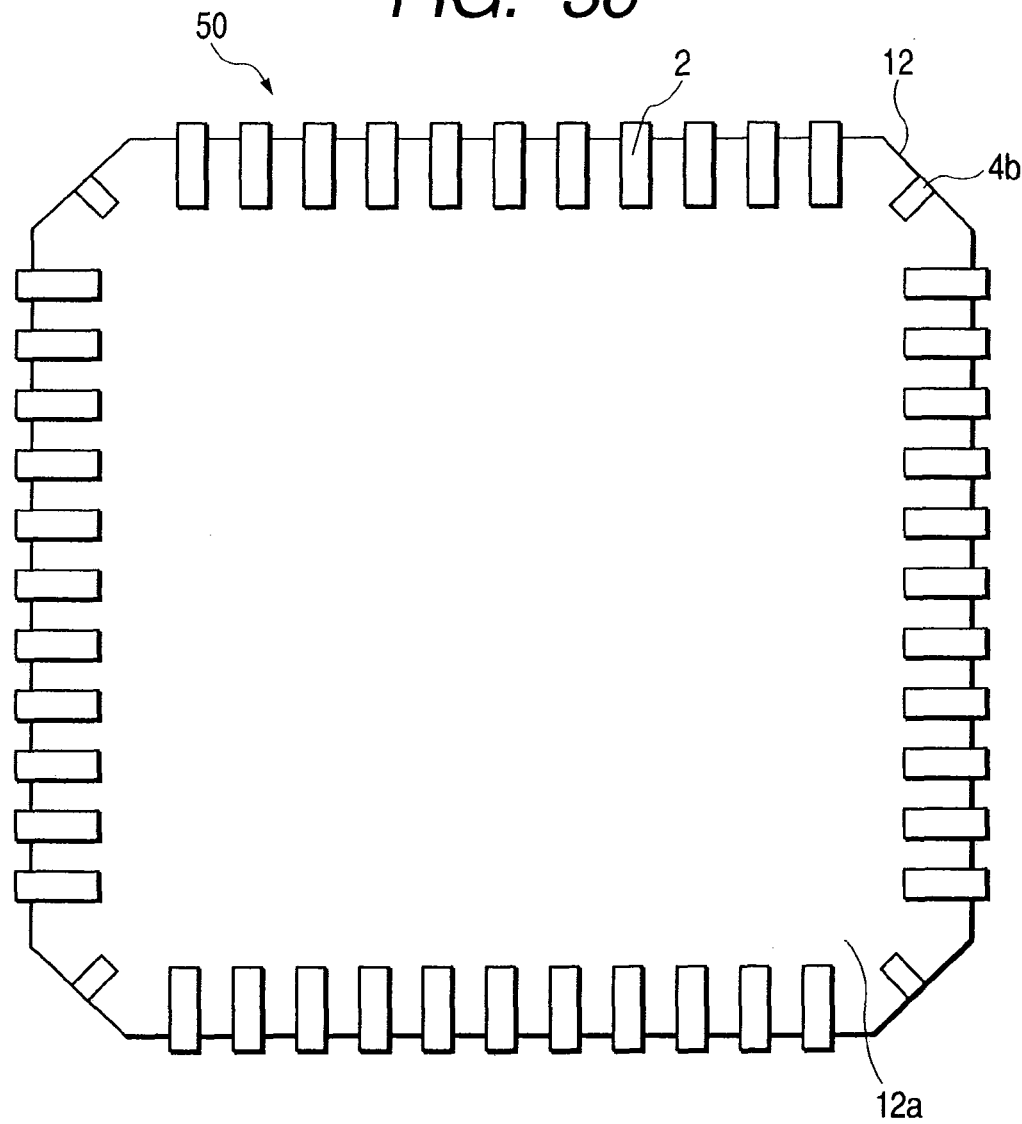
FIG. 36 shows a bottom view of the structure of the semiconductor device shown in FIG. 35.
Figure 38:
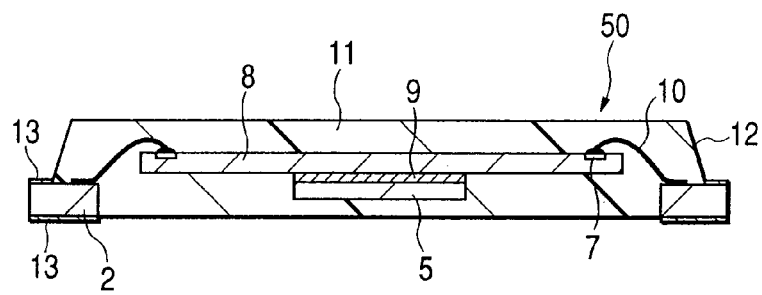
FIG. 38 shows a sectional view of the semiconductor device shown in FIG. 35 taken along line N-N.
Figure 39:
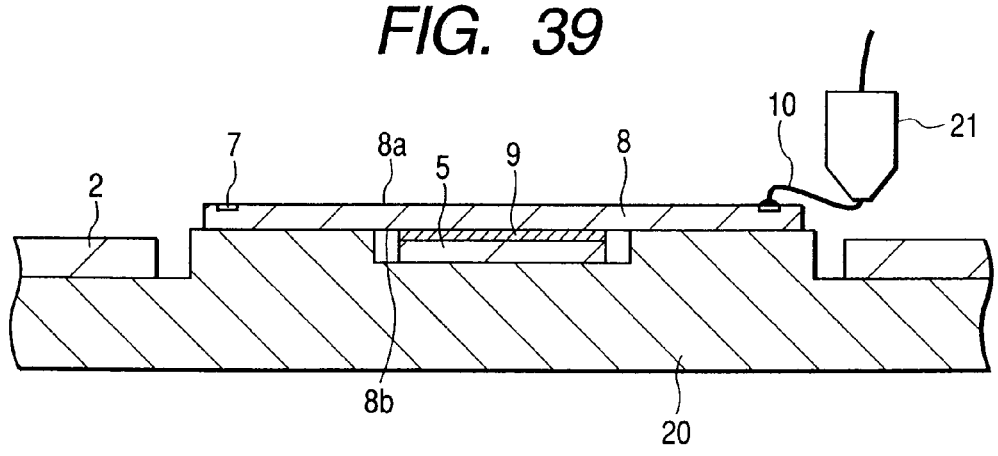
FIG. 39 shows a partial sectional view of one exemplary state at a wire-bonding process step during the assembly of the semiconductor device shown in FIG. 35.

FIG. 35 is a diagram showing a perspective view of an exterior appearance of an exemplary structure of a semiconductor device in accordance with an embodiment 4 of the invention; FIG. 36 shows a bottom view of the structure of the semiconductor device shown in FIG. 35; FIG. 37 is a cross-sectional view of the semiconductor device shown in FIG. 35 taken along line M-M; FIG. 38 is a sectional view of the semiconductor device shown in FIG. 35 taken along line N-N; and FIG. 39 is a partial sectional view of one exemplary state at a wire-bonding process step during assembly of the semiconductor device shown in FIG. 35.

The semiconductor device of the embodiment 4 is a QFN package 50 that is essentially similar to the semiconductor device as has been explained in conjunction with the embodiment 3 above.

One significant feature of the QFN package 50 shown in FIGS. 35-38 is that a plurality of tab suspension leads 4 has a support section 4a for use in supporting a tab 5 and also exposed portions 4b that are coupled thereto and exposed to the back surface 12a of a sealing member 12, wherein the support section 4a is formed so that it is thinner than the exposed portions 4b while causing said tab suspension leads 4 be coupled together via the tab 5.

More specifically, as shown in FIG. 37, the tab suspension leads 4 are designed so that these are integrally coupled together via the tab 5 while causing the support section 4a of relatively reduced thickness and exposed portions 4b of relatively increased thickness to be formed in the tab suspension leads 4, wherein the exposed portions 4b which are thick portions in the tab suspension leads 4 are disposed at four corner edge portions of the back surface 12a of the sealing member 12 as shown in FIG. 36, With such an arrangement, the support section 4a in the tab suspension leads 4 is covered by a sealing resin material 11 while simultaneously permitting the exposed portions 4b to be disposed at the corner edge portions of the back surface 12a of the sealing member 12.

In addition, as shown in FIG. 37, a chip support surface 5a of the tab 5 and chip mount side surfaces 4c of the tab suspension leads 4 are formed on the same flat plane.

To be brief, the QFN package 50 of this embodiment 4 is for minimization of exposure of the tab suspension leads 4 to the pack surface 12a of sealing member 12 to thereby prevent undesired electrical shorting between such-tab suspension leads 4 and neighboring leads 2 associated therewith during mounting of a parts mount substrate; to this end, this embodiment is arranged so that the remaining portions (support portion 4a) of the tab suspension leads 4 other than the exposed portions 4b as exposed to the corner edges of the sealing member 12 are buried or embedded within the sealing member 12.

Accordingly, the exposed portions 4b that are thick portions in the tab suspension leads 4 come to have those portions at which any sealing resin 11 is not disposed and which consists of only metals—here, the tab suspension leads 4 will later be subject to lead cutting processes.

Additionally, the support section 4a of tab suspension leads 4 is formed to be less in thickness than the exposed portions 4b by using either etching techniques (half-etching treatment) or press machining such as coiling methods, rather than by using tab-up processing through bend machining, to thereby ensure that the support surface 5a of the tab 5 and the chip mount side surfaces 4c of the tab suspension leads 4 are formed on the same flat plane; thus, the tab 5 and the support section 4a of tab suspension leads 4 are formed to have the same thickness as shown in FIG. 37.

One example is that when the exposed portions 4b of tab suspension leads 4 measure approximately 0.2 mm in thickness, the tab 5 and the support section 4a which is the same in thickness as tab 5 have a thickness ranging from about 0.08 to 0:1 mm (cutaway amount is 0.1 to 0.12 mm).

Additionally, as shown in FIG. 38, the tab 5 supporting thereon a semiconductor chip 8 is formed so that it is smaller in size than the semiconductor chip 8. In other words the QFN package 50 is the one of small size tab structure.

Accordingly, with the QFN package 50, the tab 5 and the semiconductor chip 8 are rigidly secured (die-bonded) together by adhesive 9 such as silver paste at specified portions (positions) lying inside of bonding pads 7 of the semiconductor chip 8.

It thus becomes possible during wire bonding to reliably support the periphery of a back surface 8b (the opposite surface to a principal surface 8a on which semiconductor integrated circuitry is fabricated) of the semiconductor chip 8 by a bonding stage 20 as shown in FIG. 39.

Additionally a manufacturing method of the QFN package 50 of the embodiment 4 is substantially the same as that of the QFN package 49 of the embodiment 3, except that when letting a semiconductor chip 8 be adhered to its associated tab 5 at the die bonding process step, the semiconductor chip 8 is brought into contact with the tab 5 at locations (regions) inside of its pads 7.

Furthermore, when performing braking (cutting) of tab suspension leads 4 at the lead cutting step, only metal portions that do not contain any sealing resin 11 are to be broken at the exposed portions 4b of such tab suspension leads 4.

In accordance with the QFN package 50 of the embodiment 4, letting the support section 4a of the tab 5 at the tab suspension leads 4 be formed thinner than the exposed portions 4b makes it possible to successfully permit the support section 4a to be covered with the sealing resin 11 for embedment in the sealing member 12; thus, it is possible to achieve the intended device structure with the exposed portions 4b being exposed only at the corner edges on the back surface 12a of the sealing member 12.

Whereby, it becomes possible to form an increased clearance between the exposed portions 4b of the tab suspension leads 4 and their neighboring leads 2 on the back surface 12a of the sealing member 12 while at the same time preventing electrical shorting otherwise occurring when mounting the QFN package 50 (semiconductor device) on the parts mount substrate 27 (see FIG. 23) because of the fact that the tab 5 is buried within the sealing member 12.

Another advantage is that since the sealing resin 11 is no longer disposed at the exposed portions 4b due to the fact that the exposed portions 4b are thicker than the support section 4a at the tab suspension leads 4, it becomes possible to ensure that only those metals of exposed portions 4b which contain none of the sealing resin 11 are cut away during cutting of the tab suspension leads 4, thereby preventing creation of any possible nick or gouge defects, which in turn makes it possible to improve the cutting performance at tab suspension lead cutting process steps.

Still another advantage lies in an ability to improve the surface flatness of the tab 5 per se due to the fact that the jointing of the plurality of tab suspension leads 4 via the tab 5 permits the tab 5 to be integrally coupled with the tab suspension leads 4 while allowing them to be formed of a well planarized plane coupled with the chip mount side surface thereof.

As a result, it is possible to greatly facilitate the mounting of the semiconductor chip 8 onto the tab 5 during bonding processes while simultaneously improving the resultant chip adhesiveness.

A further advantage is that letting the tab 5 and semiconductor chip 8 be contacted together at inside locations than the pads 7 of semiconductor chip 8 makes it possible to support by the bonding stage 20 those portions in close proximity to the ends of the back surface Bb of semiconductor chip 8.

It is thus possible to apply appropriate ultrasonic waves and/or heat to the bonding wires 10 during wire bonding processes, thereby improving the reliability and adhesiveness of such wire bonding.

Embodiment 5

Figure 40:
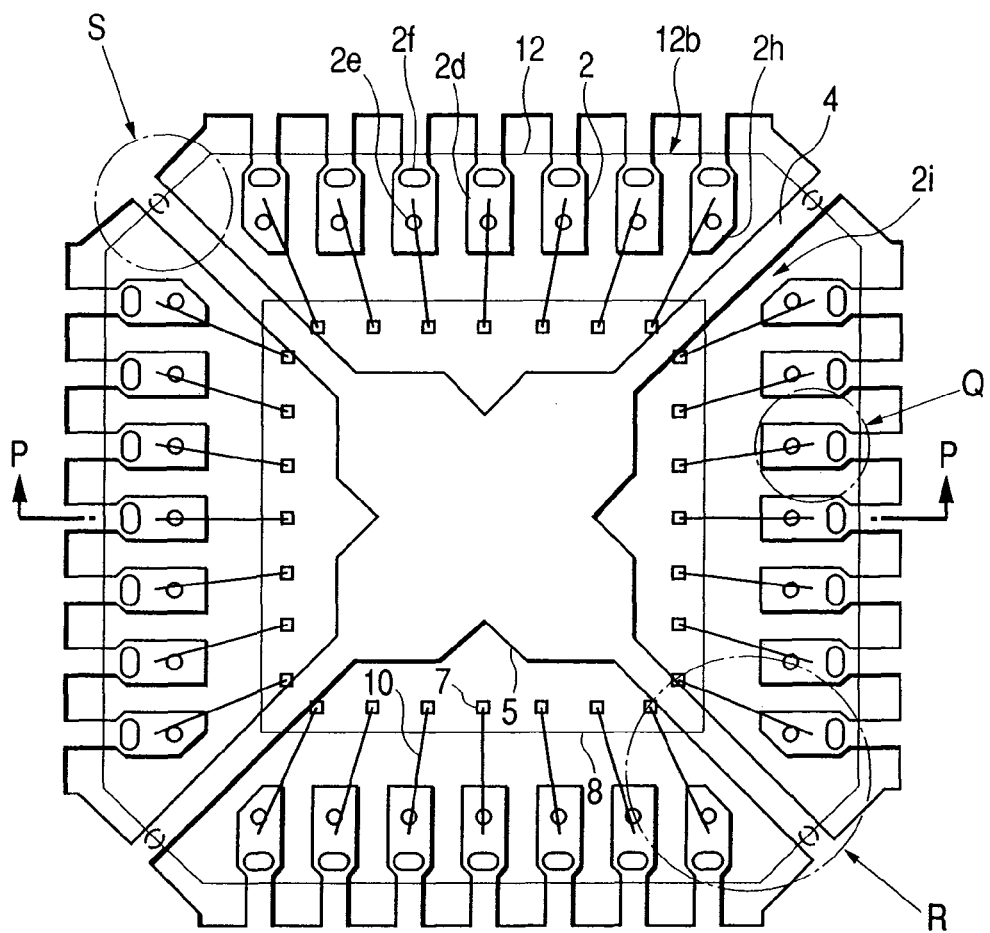
FIG. 40 shows a partial plan view of one example of the resultant structure when completion of molding in a semiconductor device in accordance with an embodiment 5 of the invention, which structure is partly broken to visualize its internal configuration for illustration purposes only.
Figure 41:
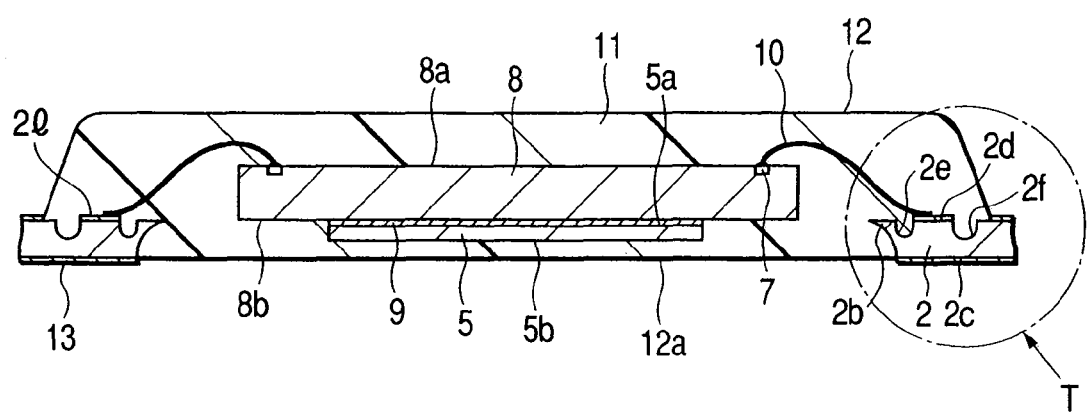
FIG. 41 shows a sectional view of the semiconductor device shown in FIG. 40 taken along line P-P.
Figure 42:
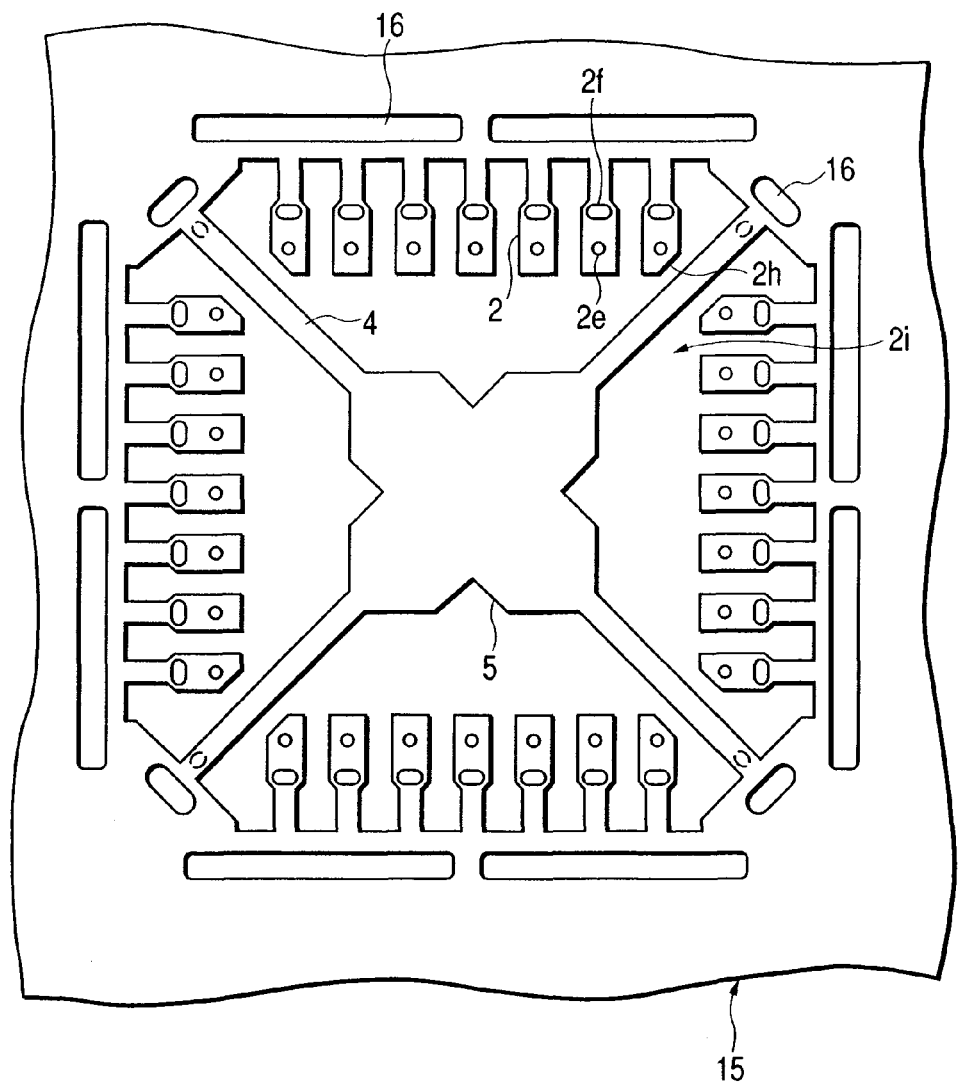
FIG. 42 shows a partial plan view of an exemplary lead frame structure for use during assembly of the semiconductor device shown in FIG. 40.
Figure 43:
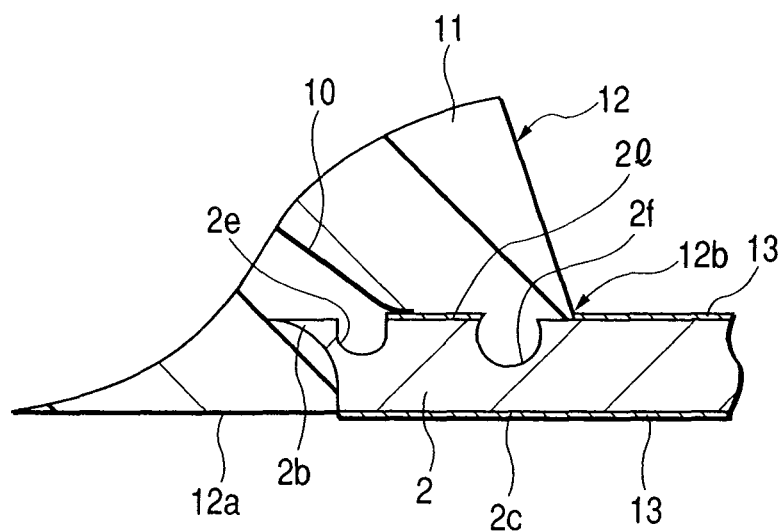
FIG. 43 shows an enlarged partial sectional view of a structure of part "T" of FIG. 41.
Figure 44:
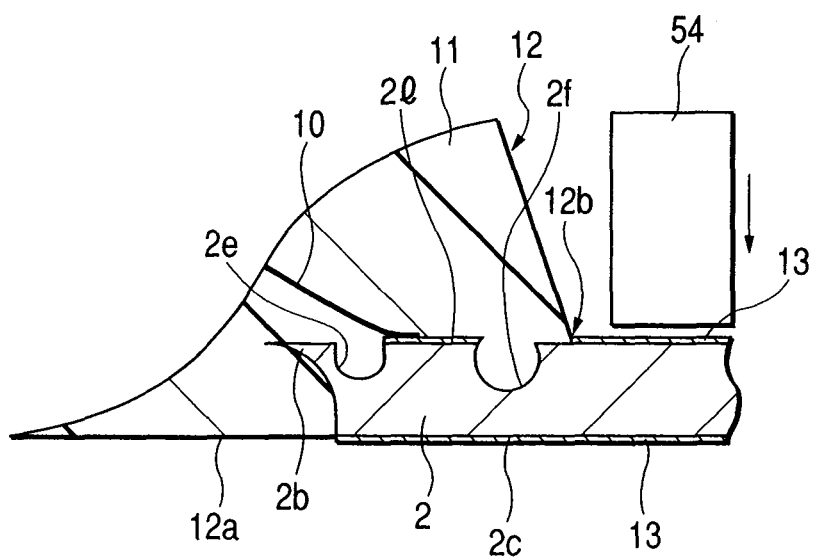
FIG. 44 shows an enlarged partial sectional view for showing an exemplary lead cut method at the part T of FIG. 41.

FIG. 40 is a diagram showing a partial plan view of one example of the resultant structure when completion of molding in a semiconductor device in accordance with an embodiment 5 of the instant invention, which structure is partly broken to visualize its internal configuration for illustration purposes only; FIG. 41 depicts a cross-sectional view of the semiconductor device shown in FIG. 40 as taken along line P-P; FIG. 42 is a partial plan view of an exemplary lead frame structure for use during assembly of the semiconductor device shown in FIG. 40; FIG. 43 is an enlarged partial sectional view of a structure of part "T" of FIG. 41; FIG. 44 is an enlarged partial sectional view for showing an exemplary lead cutting method at the part T of FIG. 41; FIG. 45 is a diagram showing a lead structure of part "Q" of FIG. 40, wherein (a) is a bottom view, (b) is a plan view, (c) is a sectional view of a groove section, (d) is a sectional view along line U-U of (b), (e) is a sectional view along line V-V of (b); and, FIG. 46 is a plan view of one possible modified example of the lead structure of part Q of FIG. 40.

Regarding the embodiment 5, an explanation will be given of the shape of leads 2 at the QFN package 50 or the like as has been explained in conjunction with the embodiment 4, along with effects and advantages thereof.

Note that FIG. 40 depicts an inside structure of a sealing member 12 at the termination of a molding process while presenting it in a manner as seen transparently through the sealing member 12 and semiconductor chip 8 for illustration purposes only.

In addition, a tab 5 shown in FIG. 40 is of the cross-type small tab structure (wherein the tab 5 is smaller in size than the semiconductor chip 8).

In the semiconductor device of the embodiment 5, a respective one of the plurality of leads 2 has a to-be-connected portion 2c as exposed to the periphery of a back surface 12a of the sealing member 12 and a thickness reduced or "thin" portion 2b as formed at an end on the tab 5 side to be thinner than to-be-connected portion 2c, wherein each lead 2 is provided with an inner groove portion (groove) 2e and outer groove portion (groove) 2f in a specified surface of the to-be-connected portion 2c (this surface will be referred to as a wire bonding surface 2d hereinafter) on the opposite side to the exposed side as disposed within the sealing member 12.

Note here that the pads 7 of semiconductor chip 8 are connected by wires 10 to wire bonding surfaces 2d of to-be-connected portions 2c of those leads 2 corresponding thereto while causing the thin portions 2b of such leads 2 to be covered by a sealing resin material 11 with the wires 10 being bonded to the to-be-connected portions 2c between the outer grooves 2f and inner grooves 2e.

Here, the thin portions 2b of the leads 2 of the embodiment 5 are formed into a knife-edge or "sword tip"-like shape to permit its tab side end to slightly project toward the tab 5, which shape may be fabricated through etching treatment (half-etching patterning) and/or press machining such as coiling. An exemplary amount of such projection may range from about 50 to 150 μm. Use of such thin portions 2b makes it possible to prevent dropdown detachment of leads 2 in a direction along the height of QFN package.

To be brief, it is possible to achieve prevention of pull-out of the leads 2 toward the QFN height direction.

In addition, the inner grooves 2e as provided in the wire bond surfaces 2d of the leads 2 are for use as markings indicative of bonding points during wire bonding. Accordingly, by forming such inner grooves 2e in the wire bonding surfaces 2d of leads 2 in specified regions lying outside of the thin portions 2b, it becomes possible to prevent the wires 10 from being bonded at such thin portions 2b.

It should be noted that as the inner grooves 2e are the grooves acting as the bonding point marks, the size thereof is smaller than that of outer grooves 2f as shown in FIG. 45.

On the other hand, the outer grooves 2f are the locations for receival of cutting stress forces during cutting of the leads 2; during lead cutting as shown in FIG. 44, let any possible cutting stress forces be concentrated to these outer grooves 2f to ensure that no such forces are hardly applied to bonding portions of the wires 10.

Furthermore, the outer grooves 2f are the ones for use in blocking a flow of hot-melt metals for metallization on the wire bonding surfaces 2d of the leads 2 during formation of a metallized layer 21 such as at a wire bonding silver metallization step as shown in FIG. 43.

In short, it is possible to permit the groove shape resulting from the presence of outer grooves 2f to be greater in absolute distance than flat surfaces; thus, it becomes possible to increase the leak pass length when forming said metallized part, thereby enabling prevention of any unwanted flow of melted metals used therefor.

Furthermore, as it is possible to permit the groove shape due to the outer grooves 2f to be greater in absolute distance than flat surfaces, it is also possible to prevent immersion or "invasion" of water component into the sealing member 12.

Additionally, as shown in FIG. 45(*b*), the outer grooves 2f are formed so that these are greater in size than the inner grooves 2e. This makes it possible to reliably perform both prevention of unwanted concentration of stress forces during lead cutting and also undesired metal flowage during metallization processes.

Note however that the dimensions and shape of the outer grooves 2f and inner grooves 2e should not be limited to those discussed above and may alternatively be modified so that the both of them have an elliptical shape of the same size as shown in FIG. 46, by way of example.

In addition, as shown in FIGS. 45(*d*) and (*e*) the leads 2 are such that each is provided on its side surfaces with knife edge portions 2g which are projected by little toward the width direction thereof.

Use of such knife edge portions 2g makes it possible to prevent the leads 2 from attempting to drop down in a direction along the height of QFN package. In other words, it is possible to prevent pull-out detachment of such leads 2 toward the QFN height direction.

Further, provision of the inner grooves 2e and outer grooves 2f in the wire bonding surfaces 2d of leads 2 permits the sealing resin material 11 to enter and fill the both groove portions; thus, it is possible to prevent unwanted dropdown detachment of the leads 2 in the elongate direction thereof (QFN horizontal direction at right angles to the QFN height direction). In short, it is possible to prevent pullout of the leads 2 toward the extending direction thereof.

It should be noted that in accordance with a method of manufacturing the semiconductor device of the embodiment 5, the pads 7 of semiconductor chip 8 are connected by wires 10 to specified portions lying between the inner grooves 2e and outer grooves 2f at the to-be-connected portions 2c of leads 2 as shown in FIG. 41 when connecting by wire bonding techniques the pads 7 of semiconductor chip 8 to the to-be-connected portion 2c of corresponding leads 2 during a wire bonding process.

Also note that regarding the inner grooves 2e and outer grooves 2f, both of them will not necessarily provided at a time and either one of them may be employed on a case-by-case basis.

One example is that only the outer groove 2f which is a single groove may be provided in the wire bonding surface 2d of a lead 2; if this is the case, a wire 10 will be bonded for electrical connection to its associated to-be-connected portion 2c at an inside location relative to the outer groove 2f.

Whereby, it is possible to prevent concentration of stress forces during lead cutting while simultaneously eliminating any irregular metal flowage during metallization processes in the same way as that stated supra.

Note that only the inner groove 2e which is a single groove may be provided in the wire bonding surface 2d of a lead 2; in such case, a wire 10 will be bonded to a to-be-connected portion 2c at part lying outside of the inner groove 2e.

This in turn makes it possible to perform the intended wire bonding at an appropriate location with the inner groove 2e being used as a bonding point marking during wire bonding.

Embodiment 6

Figure 47:
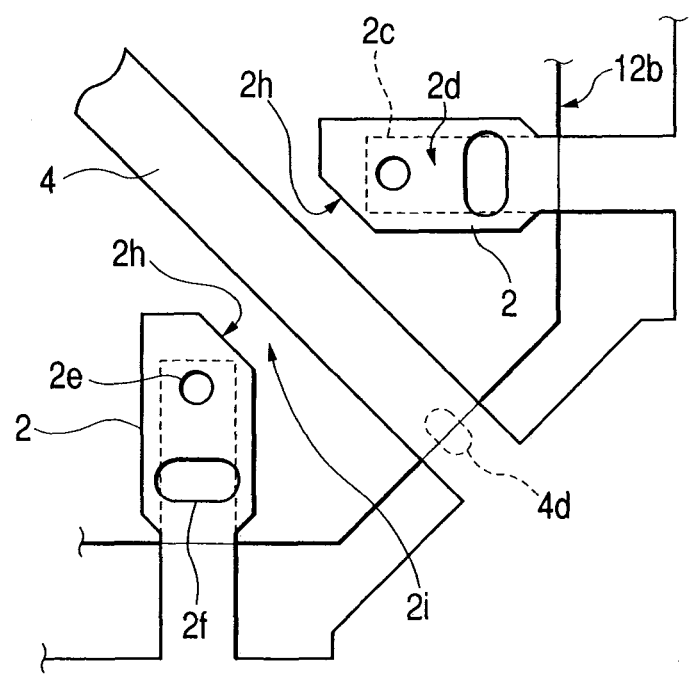
FIG. 47 shows an enlarged partial plan view of a structure of part "R" of FIG. 40.

FIG. 47 is a diagram showing an enlarged partial plan view of a structure of part "R" of FIG. 40, which has been explained in conjunction with the embodiment 5 above.

Regarding the embodiment 6 also, an explanation will be given of the shape of leads 2 at the QFN package 50 or the like as has been explained in conjunction with the embodiment 4 along with effects and advantages thereof, in a similar way to the embodiment 5.

The embodiment 6 is directed to a case where certain leads 2 of the plurality of leads 2 which are disposed neighboring a tab suspension lead 4 and placed on the opposite sides thereof are taken up, wherein a tapered section (cutaway portion) 2h is provided at a selected distal end of each lead 2 opposing the tab suspension lead 4 for formation of a gap 2i lying between the lead 2 and tab suspension lead 4 and extending along this lead 4.

This taper section 2h is a cutaway portion for formation of the gap 2i as required for effectuation of necessary processes when forming a lead pattern by etching treatment or press machining techniques—for example, a gap of about 80% of a lead plate thickness will be required for patterning purposes.

In particular, when the layout density of those leads 2 as disposed between tab suspension leads increases as a result of an increase in requisite number of pins used, the tab suspension lead side distal end of a lead 2 neighboring a tab suspension lead 4 comes closer to the tab suspension lead 4 so that it will become impossible or at least greatly difficult to perform the intended patterning of such tab suspension lead 4 or alternatively its neighboring lead 2.

Accordingly, by providing the taper section (cutaway portion) 2h for formation of the gap 2i at the tab suspension lead side distal end portion of the lead 2 in close proximity in position to the tab suspension lead 4, it becomes possible to fabricate any intended lead pattern of those leads 2 as disposed adjacent to tab suspension leads 4 while at the same time making it possible to cope with an increase in requisite number of pins used.

Embodiment 7

Figure 48A:
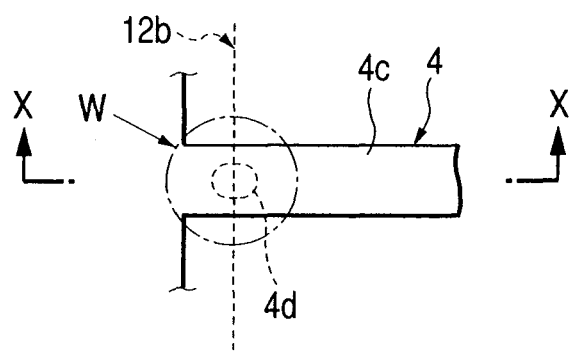
FIG. 48 shows portions (a) and (b) are diagrams showing a structure of part "S" —of FIG. 40, wherein (a) is an enlarged partial plan view whereas (b) is a sectional view of (a) along line X-X.
Figure 48B:
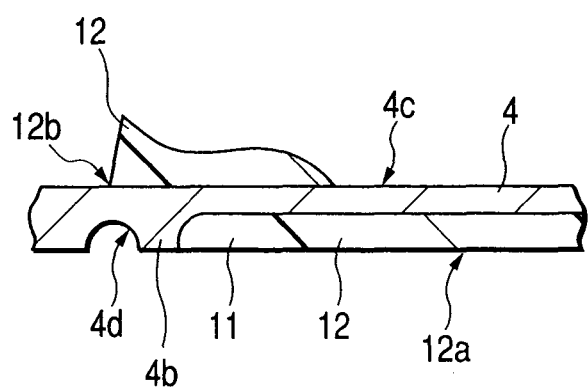
Figure 49A:
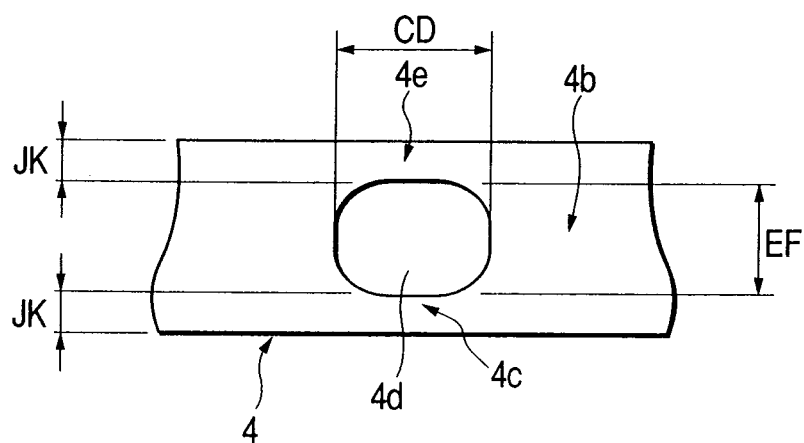
FIG. 49 shows portions (a) and (b) are diagrams showing a structure of part "W" of FIG. 48(a), wherein (a) is an enlarged partial plan view and (b) is a groove sectional view of (a).
Figure 49B:
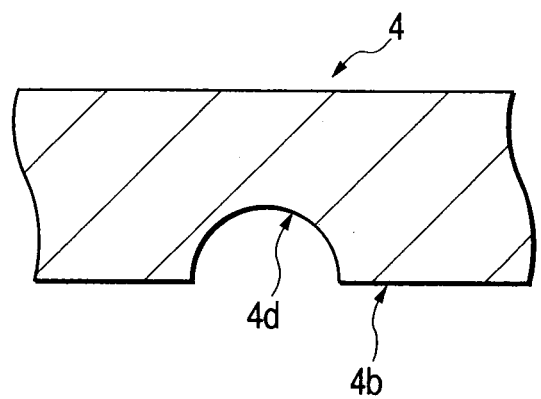

FIG. 48 is a diagram showing a structure of part "S" of FIG. 40 as has been explained in conjunction with the embodiment 5, wherein a portion (a) is an enlarged partial plan view whereas (b) is a sectional view of (a) as taken along line X-X; and FIG. 49 is a diagram showing a structure of part "W" of FIG. 48(a), wherein (a) is an enlarged partial plan view and (b) is a groove sectional view of (a).

In regard to the embodiment 7, an explanation will be given of the shape of leads 2 at the QFN package 50 or the like as has been explained in conjunction with the embodiment 4, along with effects and advantages thereof.

The embodiment 7 is directed to a case where the plurality of (four) tab suspension leads 4 for use in supporting a tab 5 are designed so that each of the tab suspension leads 4 comprises an exposed portion 4b as exposed to an end portion of a back surface 12a of a sealing member 12 and a groove portion 4d which is a thickness-reduced or "thin" portion bridging between the inside and outside of a molding line 12b (outer periphery) of the sealing member 12.

Note here that a molding metal frame structure's gate 26 (see FIG. 19) is formed at a nearby location corresponding to the mold line 12b of the tab suspension leads 4; accordingly, a sealing resin material 11 is formed to have an increased thickness at or near such location resulting in that the tab suspension leads 4 are cut in a way that resembles breaking (pull-put destruction) at lead cutting process steps.

Accordingly this groove 4d is a notch (cutaway) for permitting concentration of stress forces to thereby ensure that the breaking (cutting) of the tab suspension leads 4 is readily done during lead cutting processes, which notch is formed at a preselected location corresponding to the mold line 12b of the sealing member 12 of the tab suspension leads 4 (region linking between the inside and outside of the mold line 12b) for giving a chance during breaking of the tab suspension leads.

Further, as shown in FIGS. 48(a) and (b), the groove 4d is formed in the exposure side surface of a tab suspension lead 4 lying on the opposite side to a chip mount side surface 4c thereof.

In other words the groove 4d is formed in the surface of tab suspension lead 4 corresponding to the back surface 12a side (back side) of the sealing member 12.

Whereby, it is possible to prevent the sealing resin 11 from attempting to enter the interior of the groove 4d, which in turn makes it possible to preclude creation of nick defects otherwise occurring due to floating of resin (sealing resin 11) junk components and also punching abrasion due to resin cutting.

It is thus possible to achieve longer lifetime of a lead cutting punch 54 (see FIG. 44).

In addition, as shown in FIGS. 49(a) and (b), the groove 4d is formed into an elliptical shape that is lengthened in the elongate direction of a tab suspension lead 4, and further is surrounded by a sidewall 4e.

This is as a result of taking into consideration any possible deviation of the formation position of a sealing member 12 during molding, and is also for making sure that the groove 4d exactly overlies the mold line 12b by fabrication of the groove 4d into an elliptical shape as lengthened in the elongate direction of tab suspension lead 4 (by letting CD>EF as shown in FIG. 49(a), obtain a long narrow circular shape in the lead extension direction).

Further, by forming the sidewall 4e (JK) shown in FIG. 49(a) on the both sides of such elliptically shaped groove 4d in the lead width direction, it is possible to prevent generation of chance inhibition at the time of cutting leads due to entrance or "invasion" of resin wastage into the groove 4d.

Furthermore, as it is possible by the presence of the sidewall 4e to prevent invasion of resin wastage into the groove 4d, it becomes possible to prevent unwanted creation of nick defects due to resin wastage floating and also punching abrasion due to resin cutting, in the same way as has been stated previously.

It should be noted that in accordance with a method of manufacturing the semiconductor device of the embodiment 7, the sealing member 12 is fabricated through resin molding processes while letting the groove 4d of tab suspension lead 4 correspond to the mold line 12b (outer periphery) of the sealing member 12 at a molding process step.

More specifically the sealing member 12 is formed to ensure that the ellipse-shaped groove 4d at the tab suspension lead 4 is disposed bridging between the inside and outside of the mold line 12b.

With such an arrangement, it is possible by the presence of such groove 4d to give a chance to lead breaking destruction during lead cutting (breaking).

Embodiment 8

Figure 50A:
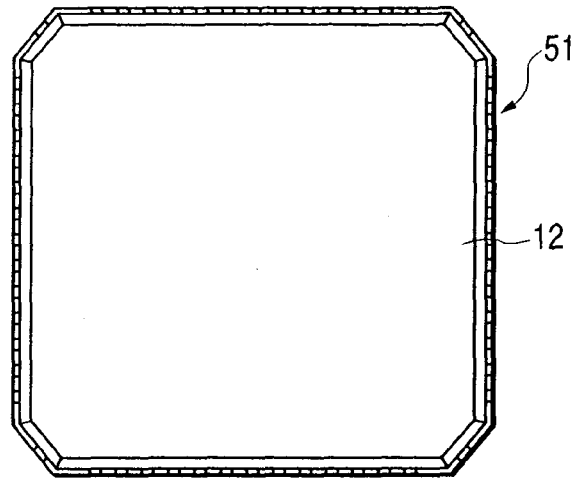
FIG. 50 shows portions (a), (b) and (c) are diagrams showing an example of the structure of a semiconductor device in accordance with an embodiment 8 of the invention, wherein (a) is a plan view, (b) is a side view, and (c) is a bottom view.
Figure 50B:
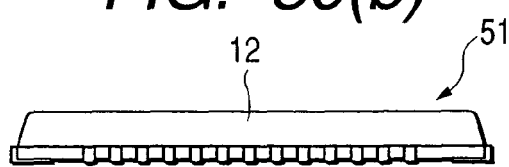
Figure 50C:
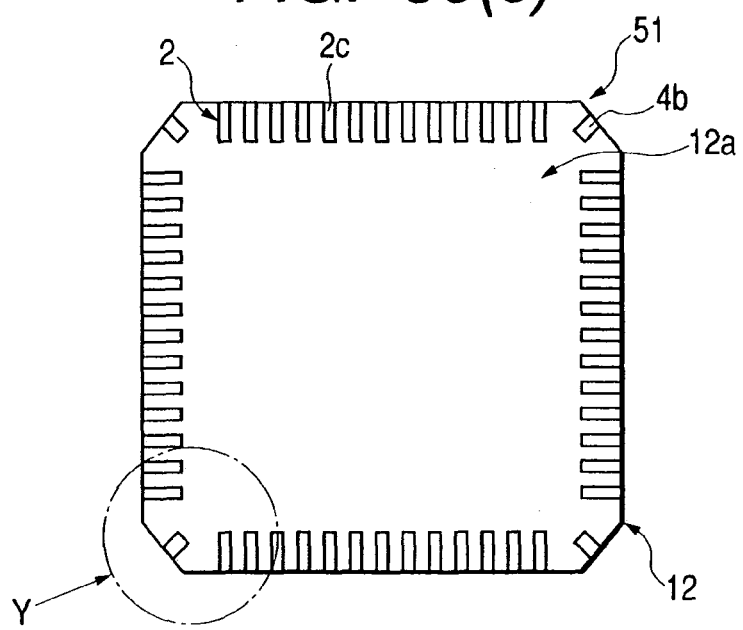
Figure 51:
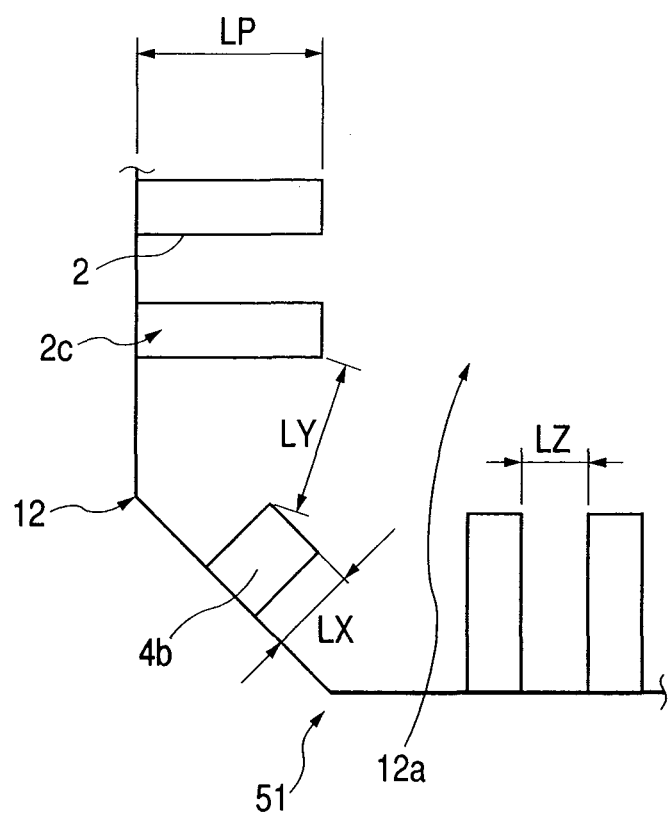
FIG. 51 shows an enlarged partial bottom view of a structure of part "Y" of FIG. 50(c).

FIG. 50 is a diagram showing an exemplary structure of a semiconductor device in accordance with an embodiment 8 of this invention, wherein (a) is a plan view, (b) is a side view, and (c) is a bottom view; and FIG. 51 is an enlarged partial bottom view of a structure of part "Y" of FIG. 50(c).

In the embodiment 8, an explanation will be given of a relation between the length of a to-be-connected portion 2c of a lead 2 in a QFN package 51 shown in FIGS. 50(a), (b) and (c) that is similar to the QFN package 50 as set forth previously in conjunction with the embodiment 4, which portion 2c is exposed to the periphery of the back surface 12a of a sealing member 12, and the length of an exposed portion 4b of a tab suspension lead 4 as exposed to a corner edge portion of the back surface 12a of the sealing member 12, along with effects and advantages thereof.

The embodiment 8 is the case where the length of the exposed portion 4b of tab suspension lead 4 in its elongate direction is formed to be shorter than the length of the to-be-connected portion 2c of lead 2 in the elongate direction thereof.

More specifically, let the length (LX) of the exposed portion 4b of tab suspension lead 4 be maximally shortened as shown in FIG. 51. This is for prevention of an increase in possibility of creation of electrical shorting when mounting a parts-mount substrate, which can occur due to approaching in distance of the exposed portion 4b of tab suspension lead 4 toward its associative leads 2 as adjacently disposed on the opposite side thereof in cases where the requisite number of leads is increased in those packages of the same size.

Accordingly, let the length (LX) of the exposed portion 4b of tab suspension lead 4 be formed so that it is shorter than the length (LP) of the to-be-connected portion 2c of lead 2 (LX<LP). Furthermore, it will be preferable that a relation of a distance (LY) between the to-be-connected portion 2c of a lead 2 neighboring the tab suspension lead 4 and the exposed portion 4b of such tab suspension lead 4 versus a distance (12) between neighboring leads be designed to satisfy (LY)(12).

With such an arrangement, it is possible to prevent electrical shorting (bridging) otherwise occurring due to the presence of any residual solder materials when mounting a parts-mount substrate of the QFN package 51.

Embodiment 9

Figure 52:
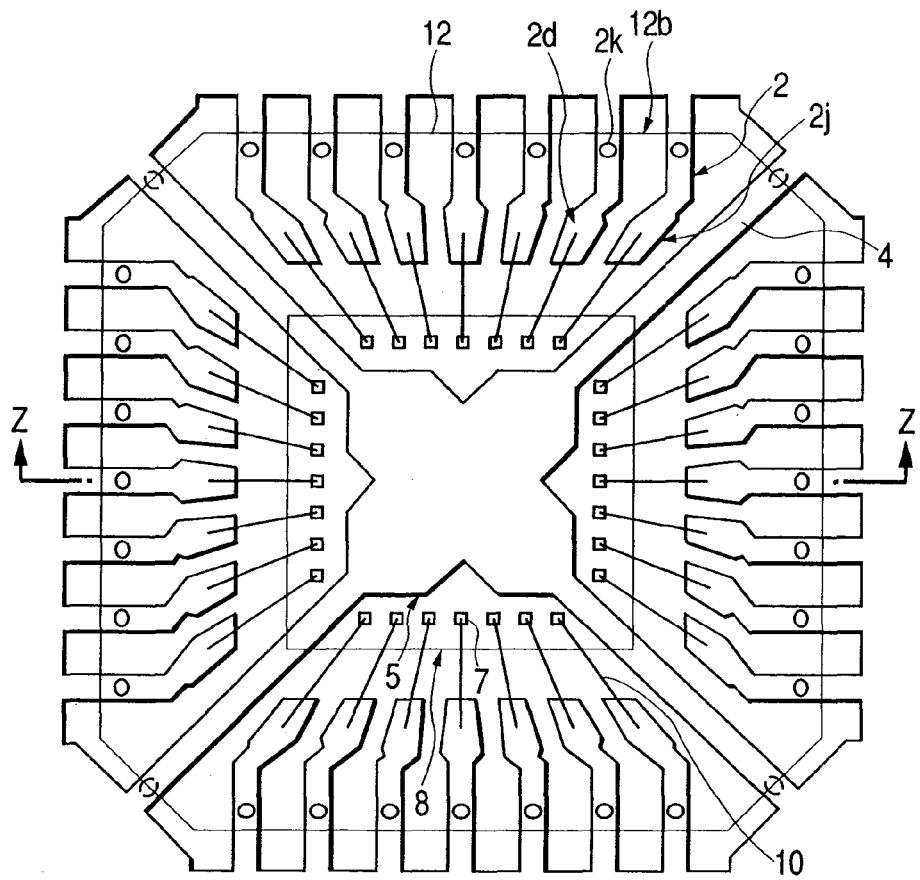
FIG. 52 shows a partial plan view of an exemplary structure of a semiconductor device in accordance with an embodiment 9 of the invention as obtained at the termination of molding, the structure having an internal configuration depicted herein as seen through a seal section thereof.
Figure 53:
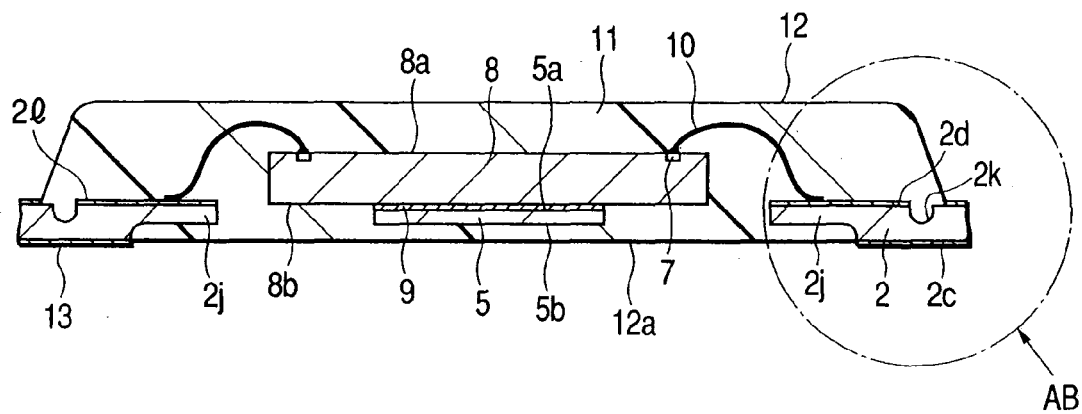
FIG. 53 shows a sectional view of the semiconductor device shown in FIG. 52 as taken along line Z-Z.
Figure 54:
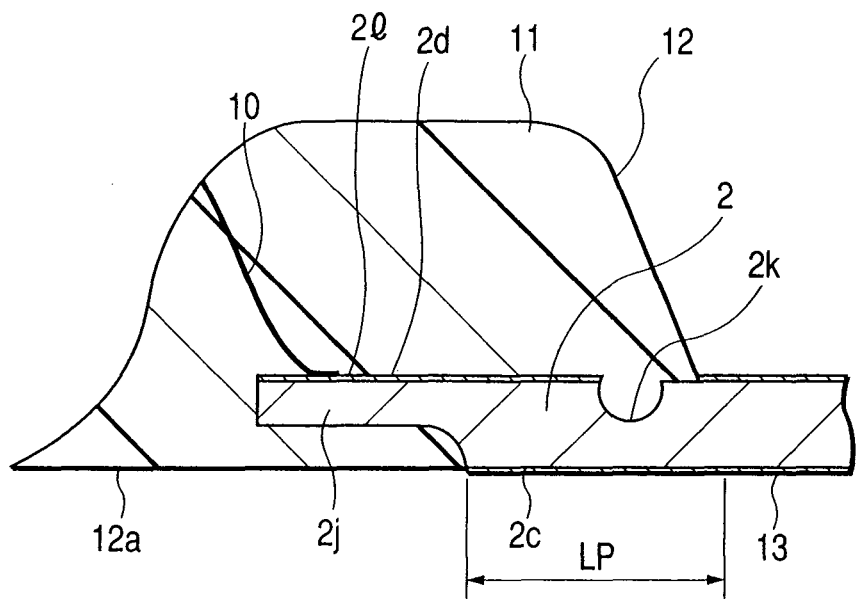
FIG. 54 shows an enlarged partial sectional view of a structure of the device at part "AB" of FIG. 53.
Figure 55:
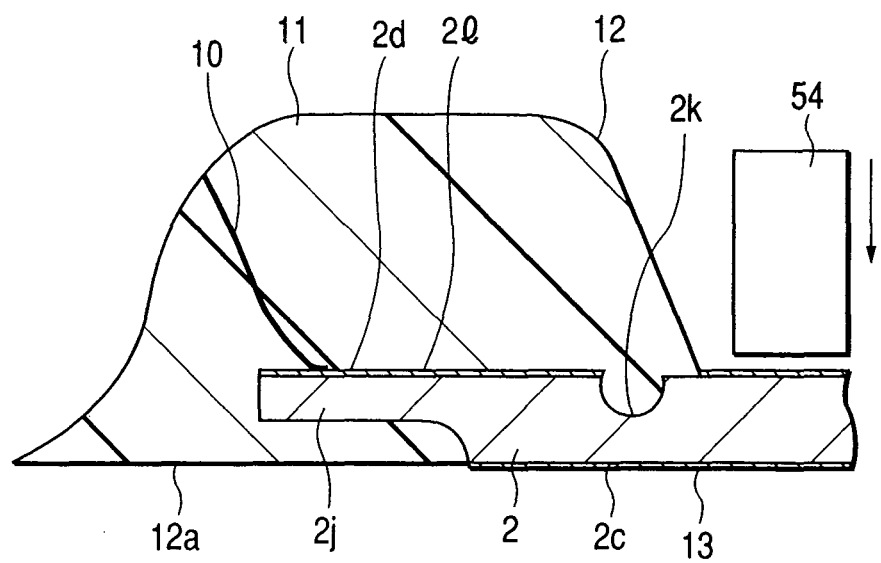
FIG. 55 shows an enlarged partial sectional view diagram showing one example of a method of cutting leads at the part "AB" of FIG. 53.
Figure 56A:
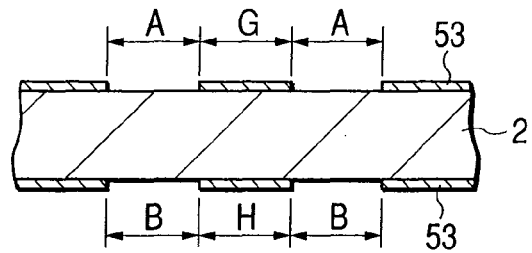
FIG. 56 shows portions (a), (b), (c) and (d) are partial sectional diagrams showing an etching method that is one example of a lead frame machining method used for assembly of the semiconductor device in accordance with the invention.
Figure 56B:
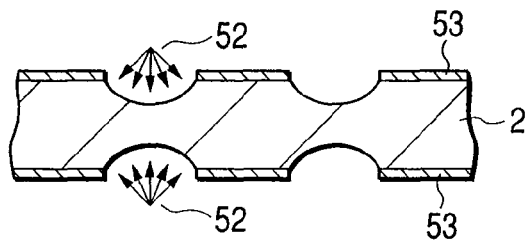
Figure 56C:
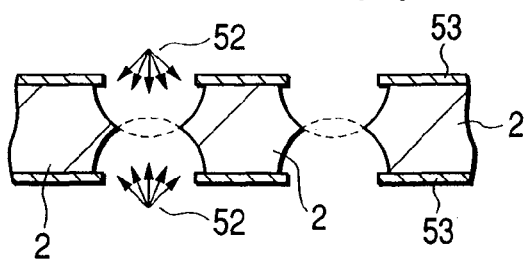
Figure 56D:
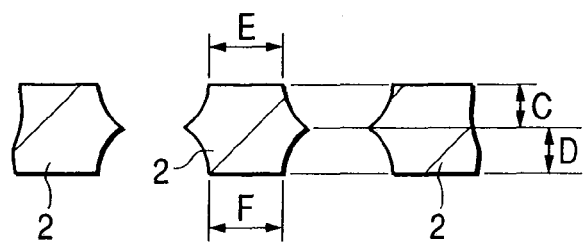
Figure 57A:
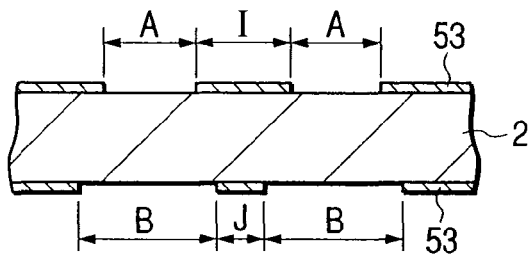
FIG. 57 shows portions (a), (b), (c) and (d) are partial sectional diagrams showing an etching method as one example of a lead frame machining method used for assembly of the semiconductor device in accordance with the invention.
Figure 57B:
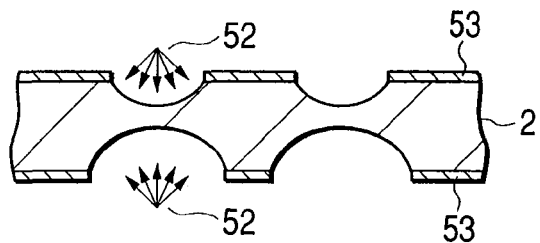
Figure 57C:
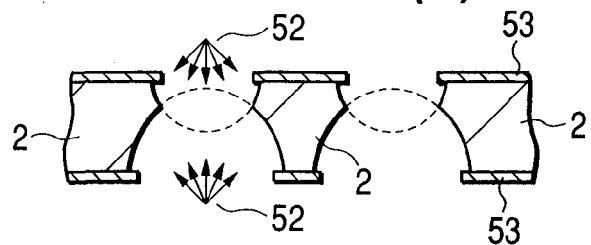
Figure 57D:
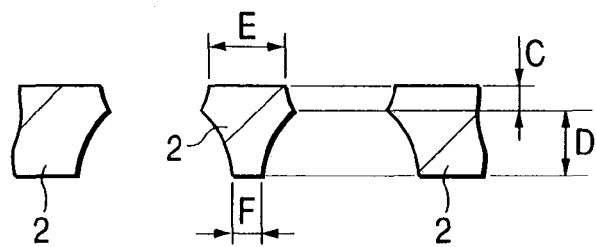

FIG. 52 is a diagram showing a partial plan view of an exemplary structure of a semiconductor device in accordance with an embodiment 9 of the invention as obtained at termination of molding, the structure having an internal configuration as seen through a seal section thereof; FIG. 53 is a cross-sectional view of the semiconductor device shown in FIG. 52 as taken along line Z-Z; FIG. 54 is an enlarged partial sectional view of a structure of the device at part "AB" of FIG. 53; and FIG. 55 is an enlarged partial sectional view diagram showing one example of a method of cutting leads at the part "AB" of FIG. 53.

In the embodiment 9, an explanation will be given of the shape of leads 2 in a semiconductor device that comprises a plurality of leads 2 having extension portions 2j that extend toward the center of a tab 5 or its nearby part and are disposed in close proximity thereto, along with effects and, advantages thereof.

Note that FIG. 52 is the one that depicts an inside structure of a sealing member 12 obtained at the termination of molding as seen transparently through the sealing member 12 and a semiconductor chip 8 for illustration purposes.

The semiconductor device of the embodiment 9 is arranged so that a respective one of the plurality of leads 2 as disposed around a tab 5 has an extended portion 2j extending toward the center of such tab 5 or its nearby part and is laid out in close proximity thereto and a to-be-connected portion 2c as exposed to the periphery of a back surface 12a of the sealing member 12, wherein the extension 2j of each lead 2 is formed to be thinner than the to-be-connected portion 2c and is covered by a sealing resin material 11, and wherein a lead groove portion (groove) 2k is formed in a wire bonding surface 2d that is a surface of the to-be-connected portion 2c on the opposite side to an exposure side as disposed within the sealing member 12.

Additionally the semiconductor device of the embodiment 9 is the one which is structurally designed so that the extension 2j is provided at a tab side end of each lead 2 for extending this lead to thereby eliminate increase in distance between the leads 2 and semiconductor chip 8 when enlargement of a package and shrinkage of semiconductor chip 8 due to an increase in pin number would result in an increase in distance between lead 2 and semiconductor chip 8.

Accordingly each lead 2 is provided at its tab side end with an extension 2j extending toward the center of the tab 5 or its nearby location (toward its corresponding pad 7), thus facilitating bonding of a wire 10 thereto.

More specifically each lead 2 is formed into a shape that is radially extended from nearby periphery of the tab 5 toward the outside as shown in FIG. 52.

Whereby, it will no longer happen that wires increase in length even when the package size is enlarged and/or when an attempt is made to miniaturize or "shrink" the semiconductor chip 8, which in turn makes it possible to suppress an increase in production cost.

It should be noted that since the length (LP) of the to-be-connected portion 2c as exposed to the back surface 12a of the sealing member 12 is defined by the EIAJ standards as shown in FIG. 54, the extension 2j must be buried or embedded within the sealing member 12 in the event that the lead 2 is provided with such extension 2j; in view of this, the semiconductor device of the embodiment 9 is specifically arranged so that the extension 2j is formed to be thinner than the to-be-connected portion 2c and is then embedded within the sealing member 12 without having to make higher the position of the extension 2j (without performing any lead rise-up processing).

More specifically, as shown in FIGS. 53-54, the extension 2j at each lead 2 is formed so that it is thinner than the to-be-connected portion 2c as exposed to the back surface 12a of the sealing member 12 and is simultaneously covered by the sealing resin 11 together with the tab 5.

Additionally the thinner formation of the extension 2j than the to-be-connected portion 2c makes it possible to prevent dropdown detachment of its associative lead 2 in the thickness direction of the sealing member 12.

Further, since the extension 2j has an increased distance in its elongate direction in comparison with the knife edge-shaped thin portion 2b shown in FIG. 41, it is also possible to dispose the bonding stage 20 (see FIG. 39) at a specified location beneath the extension 2j during wire bonding, which in turn makes it possible to apply optimal ultrasonic waves or heat to both the wires 10 and the leads 2 during wire bonding.

Note that the extension 2j may be formed thinner by etching treatment (half-etching patterning) or alternatively press machining techniques such as coiling.

Also note that as shown in FIG. 54, a lead groove portion (groove) 2k is formed at a selected location of the to-be-connected portion 2c of each lead 2 near the outside of the wire bonding surface 2d (surface on the opposite side to the exposure side) that is laid out within the sealing member 12.

This lead groove 2k is the same in function to the outer groove portion 2f (see FIG. 43) as has been explained in conjunction with the embodiment 5; thus, it is possible to concentrate cutting stress forces to this lead groove 2k during cutting processes using a punch 54 shown in FIG. 55, thereby preventing such stresses from being applied to bonding portions of wires 10.

Further, the presence of the lead groove 2k makes it possible to block a flow of hot-melt metals when forming a metal-plated layer 21 such as a silver-metallized one used for wire bonding purposes as shown in FIG. 54.

Furthermore, as it is possible to permit a groove shape due to presence of the lead groove 2k to offer a longer absolute distance than flat surfaces; thus, it becomes possible to prevent unwanted invasion of water component into the sealing member 12 also.

In addition, as the sealing resin 11 attempts to enter the lead groove 2k due to molding, it is possible to prevent dropdown detachment of leads 2 with respect to the elongate direction of such leads 2. Thus, it becomes possible to prevent pull-out of leads 2 toward the elongate direction thereof.

Embodiment 10

FIGS. 56 (*a*), (*b*), (*c*), (*d*), FIGS. 57 (*a*), (*b*), (*c*), (*d*), and FIGS. 58 (*a*), (*b*), (*c*), (*d*) are partial sectional diagrams showing a patterning method using etch techniques as one example of a lead frame machining method used for assembly of the semiconductor device in accordance with the invention.

The embodiment 10 is for explanation of one exemplary patterning method of leads 2 and tab 5 of any one of the semiconductor devices as stated supra in conjunction with the embodiments 1 to 9, etching treatment (half-etching patterning) will be explained.

It must be noted that etching liquid or etchant 52 as used during etch patterning of the embodiment 10 is liquid solution of iron (II) oxide or else, although not exclusively limited thereto.

FIGS. 56 (*a*), (*b*), (*c*), (*d*) show a method (procedure) of fabricating the intended sectional shape or "profile" of leads 2 such as shown in FIG. 45(*e*) for example; FIGS. 57 (*a*), (*b*), (*c*), (*d*) show a method (procedure) of fabricating the profile of leads 2 such as shown in FIG. 45(*d*) by way of example.

More specifically, in FIGS. 56 and 57, the etching amount on the top and bottom surfaces of leads 2 is appropriately adjusted by changing or varying the opening width (aperture area) of certain parts (portions "A" and "B") whereat a photo resist film 53 is not formed, thus enabling obtainment of respective sectional shapes.

In the patterning processes shown in FIG. 56, A is nearly equal to (=) B and G=H; thus, C=D, E=F.

Alternatively in the processes shown in FIG. 57, A<B and I>J; thus C<D, E>F.

In addition, FIGS. 58 (a), (b), (c), (d) show a method (procedure) of back-surface processing of the tab 5 shown in FIG. 53 and also performing thinning processing of extensions 2j of leads 2, for example.

Figure 58A:
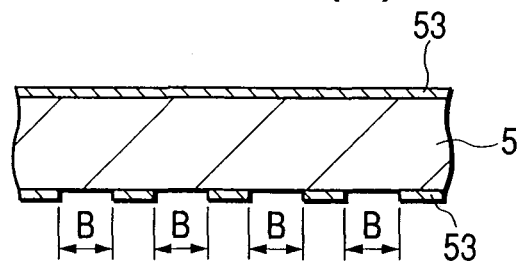
FIG. 58 shows portions (a), (b), (c) and (d) are partial sectional diagrams showing an etching method as one example of a lead frame machining method used for assembly of the semiconductor device in accordance with the invention.
Figure 58B:
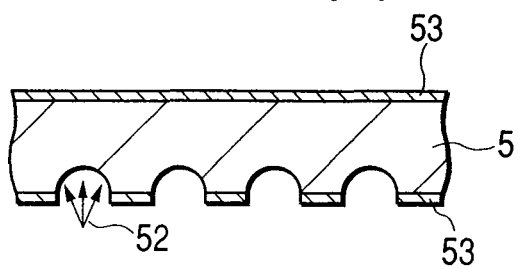
Figure 58C:
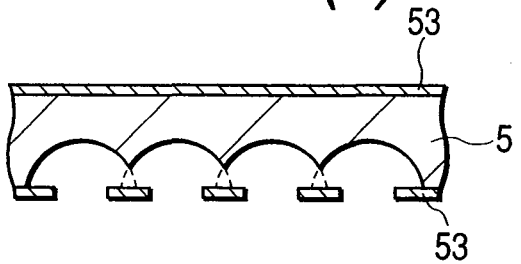
Figure 58D:
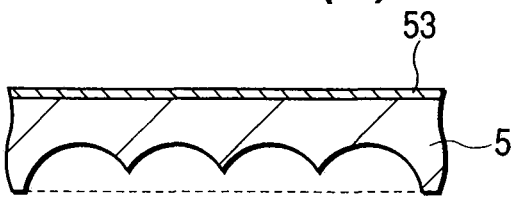

More specifically, as shown in FIG. 58(a), fabricate a photo resist film 53 at fine pitch (B) only on the processing surface side of the tab 5 and the like; then, as shown in FIG. 58(b), coat or "paint" etching liquid 52 only on said processing side, thereby realizing the intended back-surface processing of the tab 5 and the thinning processing of the extensions 2j of leads.

Embodiment 11

Figure 59A:
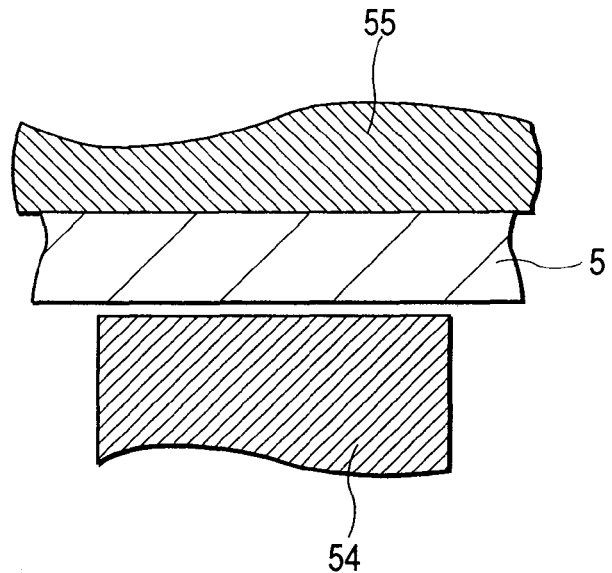
FIG. 59 shows portions (a), (b) and (c) are partial sectional diagrams showing a pressing method as one example of a lead frame machining method used for assembly of the semiconductor device in accordance with the invention.
Figure 59B:
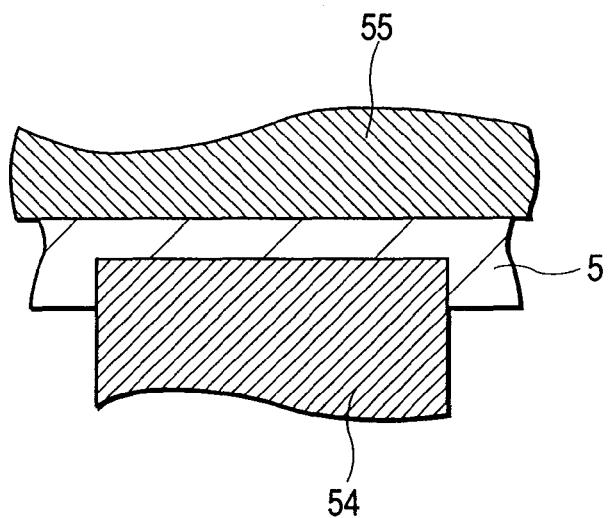
Figure 59C:
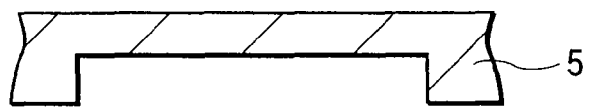
Figure 60A:
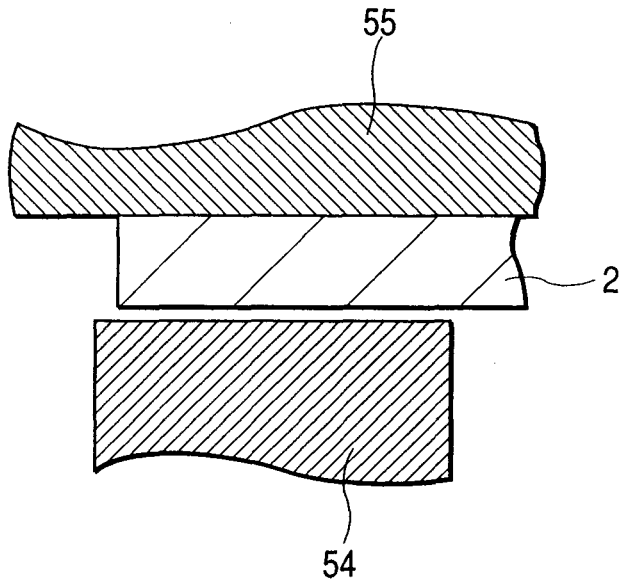
FIG. 60 shows (a), (b) and (c) are partial sectional diagrams showing a pressing method as one example of a lead frame machining method used for assembly of the semiconductor device in accordance with the invention.
Figure 60B:
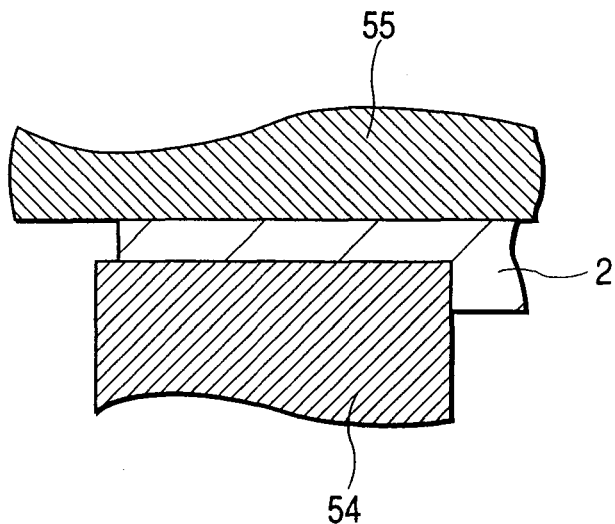
Figure 60C:
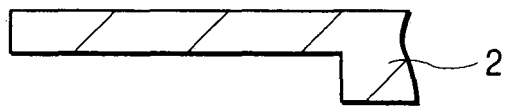
Figure 61A:
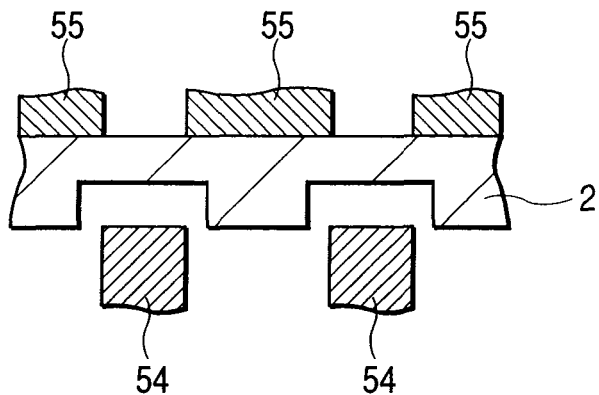
FIG. 61 shows (a), (b) and (c) are partial sectional diagrams showing a press method as one example of a lead frame machining method used for assembly of the semiconductor device in accordance with the invention.
Figure 61B:
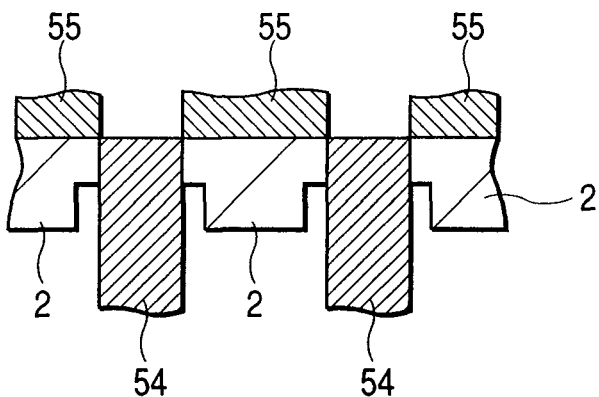
Figure 61C:
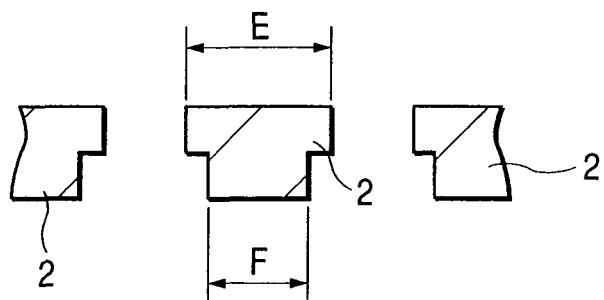

FIGS. 59 (a), (b), (c), FIGS. 60 (a), (b), (c), and FIGS. 61 (a), (b), (c) are partial sectional diagrams showing press methodology as one example of a lead frame machining method used for assembly of the semiconductor device of the invention.

The embodiment 11 is for explanation of one example of the processing method of the leads 2 and tab 5 of the semiconductor devices as has been explained in conjunction with the embodiments 1 to 9 stated supra—here, press machining such as coiling will be explained below.

FIGS. 59 (a), (b), (c) show a method (procedure) of performing by press machining techniques the back-surface processing of the tab 5 shown in FIG. 53 for example; FIGS. 60 (a), (b), (c) show a method (procedure) of performing thinning of the extensions 2j of leads 2 shown in FIG. 53 by press machining techniques, by way of example.

In other words, the both of them are for thinning either the tab 5 supported by a receiving base or pedestal 55 or the leads 2 or else through coiling by use of a punch 54.

Note that in this processing method, said coiling may be carried out at the beginning of raw material processing; or alternatively, said coiling may be applied to only necessary portions after completion of fabrication of a lead frame pattern.

Figure 45A:
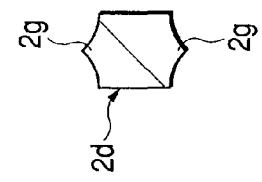
FIG. 45 shows portions (a), (b), (c), (d) and (e) are diagrams each showing a lead structure of part "Q" of FIG. 40, wherein (a) is a bottom view, (b) is a plan view, (c) is a groove sectional view, (d) is a sectional of (b) taken along line U-U, and (e) is a sectional view of (b) along line V-V.
Figure 45B:
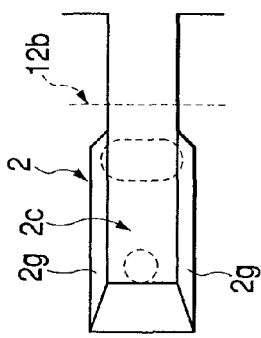
Figure 45C:
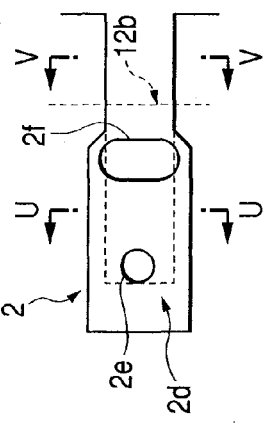
Figure 45D:
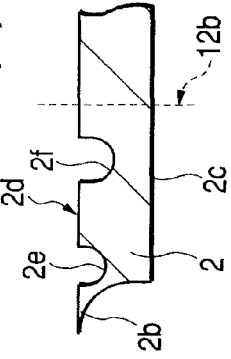
Figure 45E:
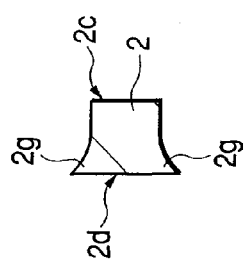
Figure 46:
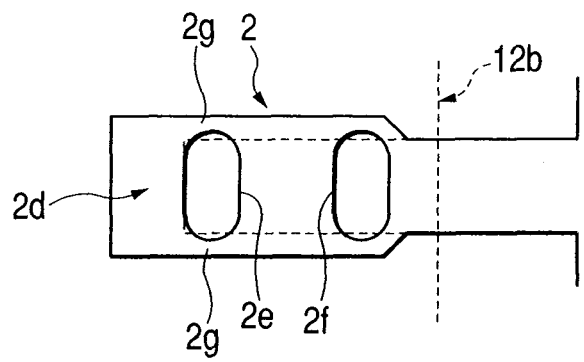
FIG. 46 shows a plan view of a modified example of the lead structure of the part Q of FIG. 40.

In addition, FIGS. 61 (a), (b), (c) show a method (procedure) of forming the lead profile as shown for example in FIG. 45(d) by use of press machining techniques.

More specifically, as shown in FIG. 61 (a), after having thinned through coiling using the punch 54 the leads 2 as supported by the pedestal 55, as shown in FIGS. 61 (b), (c), unnecessary portions are cut away for removal, thereby enabling obtainment of any desired sectional shapes of the leads 2.

While the invention has been particularly shown and described with reference to preferred embodiments thereof, the invention should not be limited only to such embodiments, and it will be understood by those skilled in the art that the foregoing and other changes in form and details may be made therein without departing from the spirit and scope of the invention.

Figure 62:
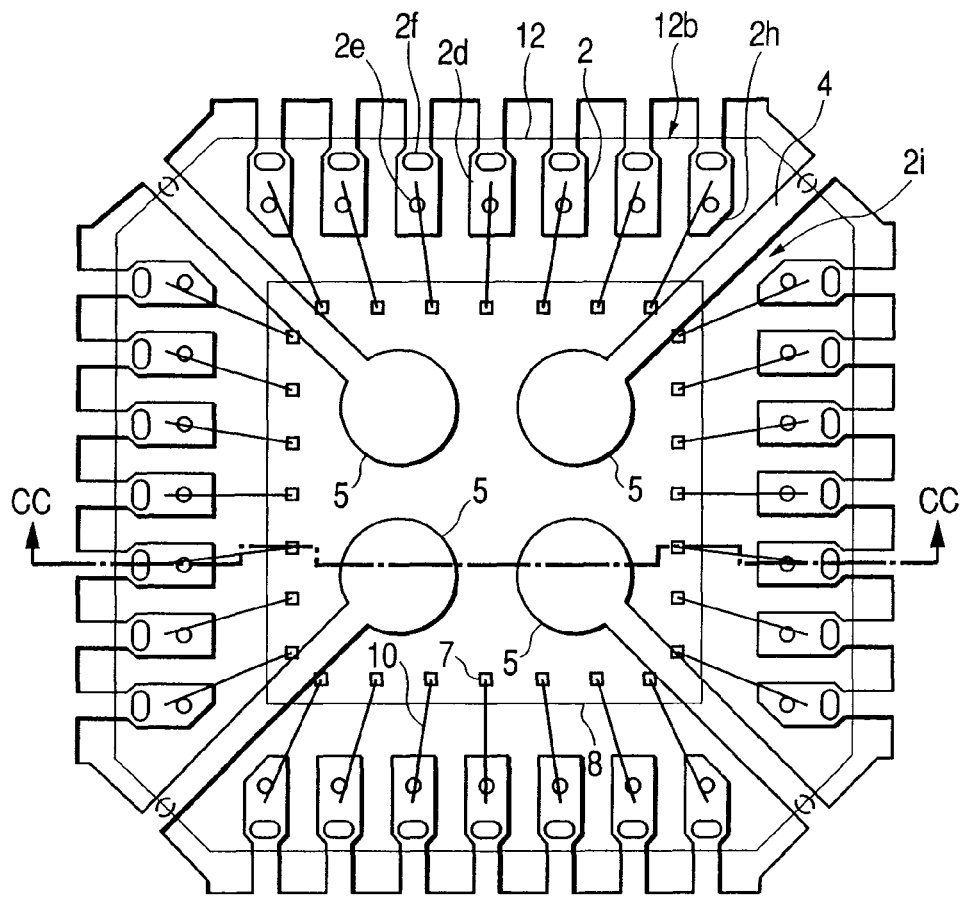
FIG. 62 shows a partial plan view of an exemplary structure of a semiconductor device in accordance with a variant of the invention as obtained at the termination of molding, the structure having an internal configuration depicted herein as seen through a seal section thereof.
Figure 64:
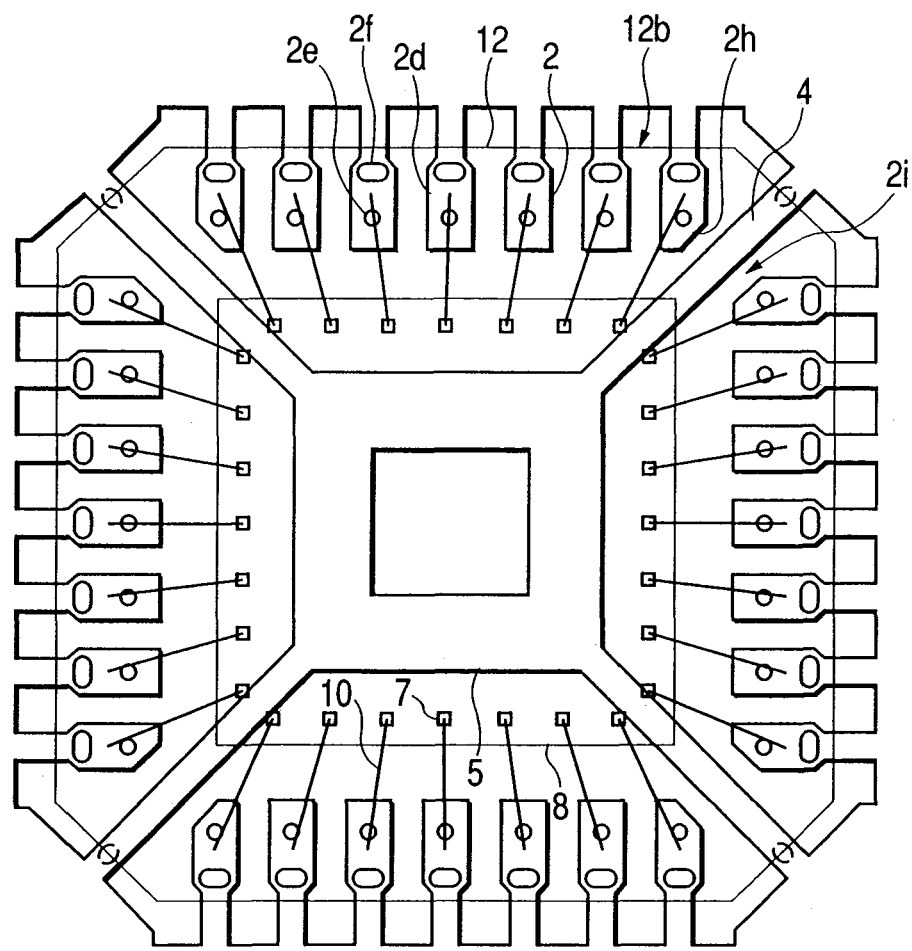
FIG. 64 shows a partial plan view of an exemplary structure of a semiconductor device in accordance with another variant of the invention as obtained at the termination of molding, the structure having an internal configuration depicted herein as seen through a seal section thereof.

For example, although said embodiments 1 to 11 stated supra are arranged so that the tab 5 is of a circular or cross-like shape, the shape of such tab 5 should not be limited thereto and may be replaced with any one of those for use in semiconductor devices in accordance with modified examples as shown in FIGS. 62 and 64.

Figure 63:
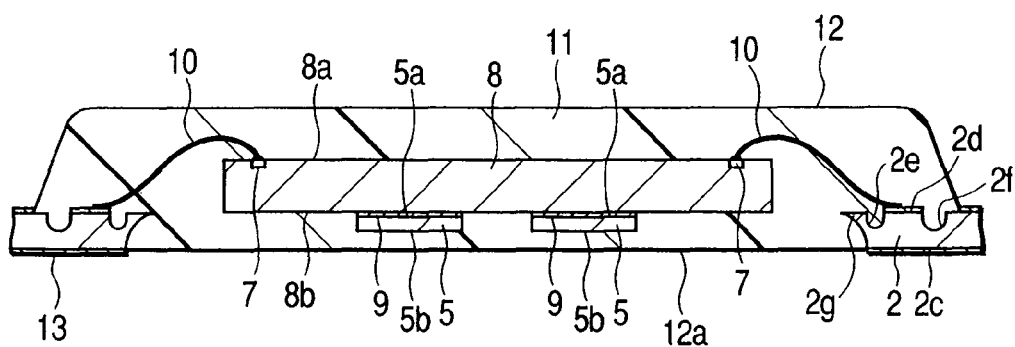
FIG. 63 shows a sectional view of the semiconductor device shown in FIG. 62 taken along line CC-CC.

The tab 5 shown in FIGS. 62 and 63 is designed to have a small tab structure by quartering; in this case, it is possible to improve the shrinkability of such tab 5 in the horizontal direction (direction horizontal relative to tab suspension leads 4) to thereby improve the temperature cycling characteristics of semiconductor devices, which in turn makes it possible to reduce chip cracking and/or package cracking accidents.

In addition, the tab 5 shown in FIG. 64 is designed to have a frame-shaped small tab structure; in this case, as it is possible to increase the bonding area of a sealing resin material 11 and the back surface 8b of a semiconductor chip 8, it becomes possible to suppress peel-off of the semiconductor chip 8 and others.

It should be noted that although in said embodiments 1 to 11 the lead frame used therein is the matrix lead frame 14, said lead frame may alternatively be modified to employ a multi-string configuration with the unit lead frames 15 being laid out into a single linear array.

It should also be noted that although in said embodiments 1-11 the semiconductor device used is a small size QFN package, said semiconductor device may be modified to those semiconductor devices of the types other than the QFN as far as they are of the peripheral type as assembled using the lead frame.

INDUSTRIAL APPLICABILITY

Effects and advantages obtainable by representative ones of the inventive teachings as disclosed herein will be explained in brief below.

(1) As it is possible to form a stepped portion or portions through half-etching patterning processes rather than formation of such stepped portions through bend/fold machining (up-set processing) to thereby permit existence of a sealing resin material at there, it becomes possible to successfully seal the tab and the tab suspension leads with the sealing resin while at the same time achieving the intended thickness-reduced or thinned structure, which in turn makes it possible to avoid the problem as to degradation of reliability due to decrease in adhesion strength as resulted from reduction of the contact area between the sealing resin and the tab.

(2) Since the lower surfaces of leads are forced to be exposed from the lower surface of a semiconductor device and are then used as external connection terminals, it is possible to prevent unwanted deformation or distortion of such leads in carriage and/or mounting events, thereby improving the reliability.

(3) As the leads used are designed to be projected very little from the side surfaces of a sealing section, it becomes possible for the semiconductor device to shrink in planar size.

(4) As the leads are formed to have their sealed or hermetic upper surfaces wider than exposed lower surfaces thereof, it is possible to attain sufficiently increased adhesiveness irrespective of the fact that the resulting bonding surfaces with the sealing resin consist of upper and side surfaces only, thereby enabling retainment of the reliability required.

(5) As the stepped portion—of a matrix lead frame is fabricated through simultaneous execution of patterning and half-etching treatment processes unlike the prior art approaches which have been designed to fabricate it through post-processing after completion of either punching or patterning using etch techniques of a metal plate, it is possible to reduce production costs of such matrix lead frame.

(6) As the matrix lead frame does no longer require effectuation of any bend/fold processes with respect to the matrix lead frame after completion of patterning as has been employed in the prior art, it becomes possible to prevent occurrence of problems such as tab dislocation defects or the like due to such folding processes.

(7) As, unlike the prior art, it is no longer required to apply bend/folding processes to the semiconductor device's external terminals, the requisite number of process steps may be reduced thereby making easier the process management to thereby improve the productivity.

(8) In all processes concerned, the currently established semiconductor manufacturing apparatus or equipment is employable for fabrication of the semiconductor device of the invention without requiring any substantive alterations thereto, which advantageously serves to eliminate or at least minimize risks of capital investment of new facility.

(9) As the stepped portion is formed by applying half-etching treatment to the lower surfaces of inner ends of leads and then sealing them with a sealing resin material, it is possible to optimally design the shape and lead pitch values in a way conformity with the semiconductor chip size and the number of pads thereof.

(10) As the tab support section at tab suspension leads is formed to be thinner than the exposed portion, it is possible to attain the intended structure with the exposed portion being exposed only to corner edge portions of the back surface of a sealing section. Whereby, it is possible to increase or maximize the clearance as defined on the back surface of the seal section between the exposed portions of the tab suspension leads and its neighboring leads; in addition, arranging the tab to be embedded within the seal section makes it possible to prevent electrical shorting otherwise occurring when mounting a semiconductor device onto a parts-mount substrate.

(11) As the sealing resin is by no means disposed at the exposed portion due to the fact that the exposed portion is thicker than the support section in the tab suspension leads, only target metal components of the exposed portion containing no sealing resin materials will be cut during tab suspension lead cutting processes; as a result, it is possible to improve the cutting performance and reliability at such tab suspension lead cutting steps.

(12) As the tab suspension leads are coupled together via a tab resulting in integral linkage between the tab and the tab suspension leads while permitting formation by a flat plane coupled to its chip mount side surface, the surface flatness of the tab per se may be improved. As a result, it is possible to make easier the procedure of mounting a semiconductor chip onto the tab during bonding while simultaneously improving the chip adhesiveness.

(13) As the tab and its associative semiconductor chip are bonded together at a selected location lying inside of an array of surface electrodes of the semiconductor chip, it is possible to stably support by a bonding stage those portions at or near the end portions on the back surface of the semiconductor chip. Thus, it is possible to apply adequate ultrasonic waves and/or heat to bonding wires during wire bonding, thereby making it possible to improve the reliability and adhesiveness of wire bonding processes.

What is claimed is:

1. A semiconductor device comprising:
a tab including a chip supporting surface, and a back surface opposite to the chip supporting surface;
a plurality of suspension leads supporting the tab;
a plurality of leads arranged between the suspension leads;
a semiconductor chip mounted over the chip supporting surface of the tab, the semiconductor chip including a main surface, and a rear surface opposite to the main surface;
a plurality of wires electrically connecting a plurality of pads of the semiconductor chip with the plurality of leads, respectively;
a seal portion sealing the semiconductor chip and the plurality of wires such that a first part of each of the leads is exposed from the seal portion, and such that second and third parts of each of the leads are covered with the seal portion;
a first plating film formed on the first part of each of the leads, and
a second plating film formed on the second part of each of the leads;
wherein each of the leads is comprised of copper;
wherein the first plating film is comprised of Pb-free solder containing Sn as a major element;
wherein the second plating film is comprised of silver;
wherein the plurality of wires are connected with the plurality of leads, respectively, via the second plating film; and
wherein a part of the rear surface of the semiconductor chip and the third part of each of the leads are contacted with the seal portion.

2. The semiconductor device according to claim 1, wherein the seal portion is comprised of epoxy resin or silicon resin.

3. A semiconductor device comprising:
a tab including a chip supporting surface, and a back surface opposite to the chip supporting surface;
a plurality of suspension leads supporting the tab;
a plurality of leads arranged between the suspension leads;
a semiconductor chip mounted over the chip supporting surface of the tab, the semiconductor chip including a main surface, and a rear surface opposite to the main surface;
a plurality of wires electrically connecting a plurality of pads of the semiconductor chip with the leads, respectively;
a seal portion sealing the semiconductor chip and the plurality of wires such that a first part of each of the leads is exposed from the seal portion, and such that second and third parts of each of the plurality of leads are covered with the seal portion;
a first plating film formed on the first part of each of the leads; and
a second plating film formed on the second part of each of the leads;
wherein each of the leads is comprised of copper;
wherein the first plating film is comprised of Pb-free solder containing Sn as a major element;
wherein the second plating film is comprised of silver;
wherein the wires are connected with the leads, respectively, via the second plating film; and
wherein a part of the rear surface of the semiconductor chip and the third part of each of the leads are contacted with the seal portion,
wherein the seal portion has an upper surface located at the chip supporting surface side of the tab, a lower surface opposite to the upper surface, and a side surface located between the upper surface and the lower surface, and
wherein the first part of each of the leads is exposed from the lower surface of the seal portion.

4. The semiconductor device according to claim 3, wherein each of the leads includes a bonding surface, and a mounting surface opposite to the bonding surface,
wherein each of the leads has one end portion, the other end portion located farther than the one end portion from the tab, and wherein the mounting surface of the one end portion of each of the leads is covered with the seal portion.

5. The semiconductor device according to claim 3, wherein the seal portion is comprised of epoxy resin or silicon resin.

6. A semiconductor device comprising:
a tab including a chip supporting surface, and a back surface opposite to the chip supporting surface;
a plurality of suspension leads supporting the tab;
a plurality of leads arranged between the suspension leads;
a semiconductor chip mounted over the chip supporting surface of the tab, the semiconductor chip including a main surface, and a rear surface opposite to the main surface;
a plurality of wires electrically connecting a plurality of pads of the semiconductor chip with the plurality of leads, respectively;
a seal portion sealing the semiconductor chip and the plurality of wires such that a first part of each of the leads is exposed from the seal portion, and such that second and third parts of each of the leads are covered with the seal portion;
a first plating film formed on the first part of each of the leads, and
a second plating film formed on the second part of each of the leads;
wherein each of the leads is comprised of copper;
wherein the first plating film is comprised of Pb-free solder containing Sn as a major element;
wherein the second plating film is comprised of silver;
wherein the plurality of wires are connected with the plurality of leads, respectively, via the second plating film; and
wherein a part of the rear surface of the semiconductor chip and the third part of each of the leads are connected with the seal portion,
wherein the seal portion has an upper surface located at the chip supporting surface side of the tab, a lower surface opposite to the upper surface, and a side surface located between the upper surface and the lower surface,
wherein the first part of each of the leads is exposed from the lower surface of the seal portion, and
wherein the back surface of the tab is covered with the seal portion.

7. The semiconductor device according to claim 6, wherein each of the leads includes a bonding surface, and a mounting surface opposite to the bonding surface,
wherein each of the leads has one end portion, the other end portion located farther than the one end portion from the tab, and
wherein the mounting surface of the one end portion of each of the leads is covered with the seal portion.

8. The semiconductor device according to claim 6, wherein the seal portion is comprised of epoxy resin or silicon resin.

9. A semiconductor device comprising:
a tab including a chip supporting surface, and a back surface opposite to the chip supporting surface;
a plurality of suspension leads supporting the tab;
a plurality of leads arranged between the suspension leads;
a semiconductor chip mounted over the chip supporting surface of the tab, the semiconductor chip including a main surface, and a rear surface opposite to the main surface;
a plurality of wires electrically connecting a plurality of pads of the semiconductor chip with the plurality of leads, respectively;
a seal portion sealing the semiconductor chip and the plurality of wires such that a first part of each of the leads is exposed from the seal portion, and such that second and third parts of each of the leads are covered with the seal portion;
a first plating film formed on the first part of each of the leads, and
a second plating film formed on the second part of each of the leads;
wherein each of the leads is comprised of copper;
wherein the first plating film is comprised of Pb-free solder containing Sn as a major element;
wherein the second plating film is comprised of silver;
wherein the plurality of wires are connected with the plurality of leads, respectively, via the second plating film; and
wherein a part of the rear surface of the semiconductor chip and the third part of each of the leads are contacted with the seal portion,
wherein the seal portion has an upper surface located at the chip supporting surface side of the tab, a lower surface opposite to the upper surface, and a side surface located between the upper surface and the lower surface,
wherein the first part of each of the leads is exposed from the lower surface of the seal portion,
wherein the back surface of the tab is covered with the seal portion, and
wherein a thickness of the tab is thinner than that of each of the leads.

10. The semiconductor device according to claim 9, wherein the seal portion is comprised of epoxy resin or silicon resin.

* * * * *